(12) United States Patent
Hou et al.

(10) Patent No.: US 11,562,975 B2
(45) Date of Patent: Jan. 24, 2023

(54) BONDED ASSEMBLY EMPLOYING METAL-SEMICONDUCTOR BONDING AND METAL-METAL BONDING AND METHODS OF FORMING THE SAME

(71) Applicant: SANDISK TECHNOLOGIES LLC, Addison, TX (US)

(72) Inventors: Lin Hou, Leuven (BE); Peter Rabkin, Cupertino, CA (US); Masaaki Higashitani, Cupertino, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 83 days.

(21) Appl. No.: 17/244,387

(22) Filed: Apr. 29, 2021

(65) Prior Publication Data
US 2022/0352104 A1  Nov. 3, 2022

(51) Int. Cl.
*H01L 25/065* (2006.01)
*H01L 23/00* (2006.01)
(Continued)

(52) U.S. Cl.
CPC ............. *H01L 24/06* (2013.01); *H01L 24/05* (2013.01); *H01L 24/08* (2013.01); *H01L 24/80* (2013.01);
(Continued)

(58) Field of Classification Search
CPC ......... H01L 24/06; H01L 24/05; H01L 24/08; H01L 24/80; H01L 25/0657; H01L 25/18;
(Continued)

(56) References Cited

U.S. PATENT DOCUMENTS 6,376,353 B1   4/2002  Zhou et al.
10,283,493 B1  5/2019  Nishida
(Continued)

FOREIGN PATENT DOCUMENTS

EP     3828922 A1    6/2021

OTHER PUBLICATIONS

Burleigh, T. D. et al., "Effect of alloying on the resistance of Cu-10% Ni alloys to seawater impingement," Corrosion 55.8 (1999): 800-804.
(Continued)

*Primary Examiner* — Thanh Y. Tran
(74) *Attorney, Agent, or Firm* — The Marbury Law Group, PLLC

(57) ABSTRACT

A bonded assembly of a first semiconductor die and a second semiconductor die includes first and second semiconductor dies. The first semiconductor die includes first semiconductor devices, first metal interconnect structures embedded in first dielectric material layers, and first metal bonding pads laterally surrounded by a semiconductor material layer. The second semiconductor die includes second semiconductor devices, second metal interconnect structures embedded in second dielectric material layers, and second metal bonding pads that include primary metal bonding pads and auxiliary metal bonding pads. The auxiliary metal bonding pads are bonded to the semiconductor material layer through metal-semiconductor compound portions formed by reaction of surface portions of the semiconductor material layer and an auxiliary metal bonding pad. The primary metal bonding pads are bonded to the first metal bonding pads by metal-to-metal bonding.

20 Claims, 19 Drawing Sheets

(51) Int. Cl.
  *H01L 25/18* (2006.01)
  *H01L 25/00* (2006.01)
(52) U.S. Cl.
  CPC .......... *H01L 25/0657* (2013.01); *H01L 25/18* (2013.01); *H01L 25/50* (2013.01); *H01L 2224/0518* (2013.01); *H01L 2224/05155* (2013.01); *H01L 2224/05157* (2013.01); *H01L 2224/05169* (2013.01); *H01L 2224/05193* (2013.01); *H01L 2224/06517* (2013.01); *H01L 2224/08145* (2013.01); *H01L 2224/80895* (2013.01); *H01L 2224/80896* (2013.01); *H01L 2924/048* (2013.01); *H01L 2924/0476* (2013.01); *H01L 2924/0479* (2013.01); *H01L 2924/1431* (2013.01); *H01L 2924/14511* (2013.01)
(58) Field of Classification Search
  CPC ........... H01L 25/50; H01L 2224/05193; H01L 2224/06517; H01L 2224/08145; H01L 2224/80895; H01L 2224/80896; H01L 2924/1431; H01L 2924/14511
  See application file for complete search history.

(56) References Cited

U.S. PATENT DOCUMENTS

| | | | |
|---|---|---|---|
| 10,354,980 | B1 | 7/2019 | Mushiga et al. |
| 10,354,987 | B1 | 7/2019 | Mushiga et al. |
| 10,510,738 | B2 | 12/2019 | Kim et al. |
| 10,714,497 | B1 | 7/2020 | Nishida et al. |
| 10,797,062 | B1 | 10/2020 | Nishikawa et al. |
| 10,910,272 | B1 | 2/2021 | Zhou et al. |
| 2005/0098605 | A1 | 5/2005 | Edelstein et al. |
| 2009/0014848 | A1 | 1/2009 | Ong Wai Lian et al. |
| 2012/0091568 | A1 | 4/2012 | Ong Wai Lian et al. |
| 2019/0221557 | A1 | 7/2019 | Kim et al. |
| 2020/0161263 | A1* | 5/2020 | Chen .................. H03K 19/1776 |
| 2020/0251149 | A1* | 8/2020 | Zhang .................... G11C 5/063 |
| 2020/0266146 | A1* | 8/2020 | Nishida ............... H01L 23/5283 |
| 2021/0375959 | A1* | 12/2021 | Hung ................ H01L 27/14643 |

OTHER PUBLICATIONS

Cere, S. et al., "Properties of the passive films present on copper and copper-nickel alloys in slightly alkaline solutions," Journal of materials science letters 21.6 (2002): 493-495.
Cho, B-J. et al. "Effect of pH and chemical mechanical planarization process conditions on the copper-benzotriazole complex formation," Japanese Journal of Applied Physics 55.6S3 (2016): 06JB01.
Haesevoets, et al., "Copper Rich Cu1—xNix Alloys (0.05< x< 0.15) Electrodeposited from Acid Sulfate-Based Electrolyte with Benzotriazole Additive for Microbump Metallization for 3D Stacked Integrate Circuits." Journal of The Electrochemical Society 166.8 (2019): D315.
Jin, T., et al. "Surface Characterization and Corrosion Behavior of 90/10 Copper-Nickel Alloy in Marine Environment," Materials 12.11 (2019): 1869.
Kioxia, "Toshiba Develops World's First 16-die Stacked NAND Flash Memory with TSV Technology," https://about.kioxia.com/en-apac/news/2015/20150806-1.html visited April 30, 2021.
Lelevic, A. et al., "Electrodeposition of NiP alloy coatings: A review," Surface and Coatings Technology 369 (2019): 198-220.
Lokhande, A. C. et al., "Studies on enhancement of surface mechanical properties of electrodeposited Ni—Co alloy coatings due to saccharin additive," Surface and Coatings Technology 258 (2014): 225-231.
Murakami, T. et al., "Nickel Silicide Formation Using a Stacked Hotplate-Based Low Temperature Annealing System," Presented at 203rd Electrochemical Society Meeting in Paris (May 2003).
Offoiach, R., et al. "Tribocorrosion study of Ni/B electrodeposits with low B content," Surface and Coatings Technology 369 (2019): 1-15.
Panigrahi, A.K., et al. "Oxidation Resistive, CMOS Compatible Copper-Based Alloy Ultrathin Films as a Superior Passivation Mechanism for Achieving 150 C Cu—Cu Wafer on Wafer Thermocompression Bonding," IEEE Transactions on Electron Devices 64.3 (2017): 1239-1245.
Roberts, B. et al., "Interconnect metallization for future device generations," Solid State Technology. Feb. 95, vol. 38 Issue 2, p. 69 (1995).
Ryu, H-Y., et al. "Selection and Optimization of Corrosion Inhibitors for Improved Cu CMP and Post-Cu CMP Cleaning," ECS Journal of Solid State Science and Technology 8.5 (2019): P3058.
Salicio-Paz, A. et al. "Monolayered versus multilayered electroless NiP coatings: impact of the plating approach on the microstructure, mechanical and corrosion properties of the coatings," Surface and Coatings Technology 368 (2019): 138-146.
Salleh, S. et al., "Effects of non-spherical colloidal silica slurry on Al—NiP hard disk substrate CMP application," Applied Surface Science 360 (2016): 59-68.
Smith, M.A. et al., "A Low-Temperature Nickel Silicide Process for Wafer Bonding and High-Density Interconnects," IEEE Transactions on Components, Packaging and Manufacturing Technology, vol. 10, No. 5, pp. 908-916, May 2020.
Tom's Hardware, "Facebook Asks for QLC NAND, Toshiba Answers with 100TB QLC SSDs with TSV," http://www.tomshardware.com/news/qlc-nand-ssd-toshiba-facebook,32451.html visited Apr. 30, 2021.
Varea, A. et al., "Mechanical properties and corrosion behaviour of nanostructured Cu-rich CuNi electrodeposited films," Int. J. Electrochem. Sci 7.2 (2012): 1288-1302.
Wang, Y. L. et al., "Material characteristics and chemical-mechanical polishing of aluminum alloy thin films " Thin Solid Films 332.1-2 (1998): 397-403.
Zhou, J. et al., "Study on the film forming mechanism, corrosion inhibition effect and synergistic action of two different inhibitors on copper surface chemical mechanical polishing for GLSI," Applied Surface Science 505 (2020): 144507.
U.S. Appl. No. 16/291,504, filed Mar. 4, 2019, SanDisk Technologies LLC.
U.S. Appl. No. 16/291,577, filed Mar. 4, 2019, SanDisk Technologies LLC.
U.S. Appl. No. 16/523,029, filed Jul. 26, 2019, SanDisk Technologies LLC.
U.S. Appl. No. 16/682,848, filed Nov. 13, 2019, SanDisk Technologies LLC.
U.S. Appl. No. 16/694,400, filed Nov. 25, 2019, SanDisk Technologies LLC.
U.S. Appl. No. 16/728,327, filed Dec. 27, 2019, SanDisk Technologies LLC.
U.S. Appl. No. 16/742,213, filed Jan. 14, 2020, SanDisk Technologies LLC.
U.S. Appl. No. 16/774,372, filed Jan. 28, 2020, SanDisk Technologies LLC.
U.S. Appl. No. 16/774,446, filed Jan. 28, 2020, SanDisk Technologies LLC.
U.S. Appl. No. 16/825,304, filed Mar. 20, 2020, SanDisk Technologies LLC.
U.S. Appl. No. 16/825,397, filed Mar. 20, 2020, SanDisk Technologies LLC.
U.S. Appl. No. 16/851,839, filed Apr. 17, 2020, SanDisk Technologies LLC.
U.S. Appl. No. 16/851,908, filed Apr. 17, 2020, SanDisk Technologies LLC.
U.S. Appl. No. 16/891,843, filed Jun. 3, 2020, SanDisk Technologies LLC.
U.S. Appl. No. 17/094,543, filed Nov. 10, 2020, SanDisk Technologies LLC.
U.S. Appl. No. 17/106,884, filed Nov. 30, 2020, SanDisk Technologies LLC.
U.S. Appl. No. 17/118,036, filed Dec. 10, 2020, SanDisk Technologies LLC.

(56) References Cited

OTHER PUBLICATIONS

U.S. Appl. No. 17/167,161, filed Feb. 4, 2021, SanDisk Technologies LLC.

* cited by examiner

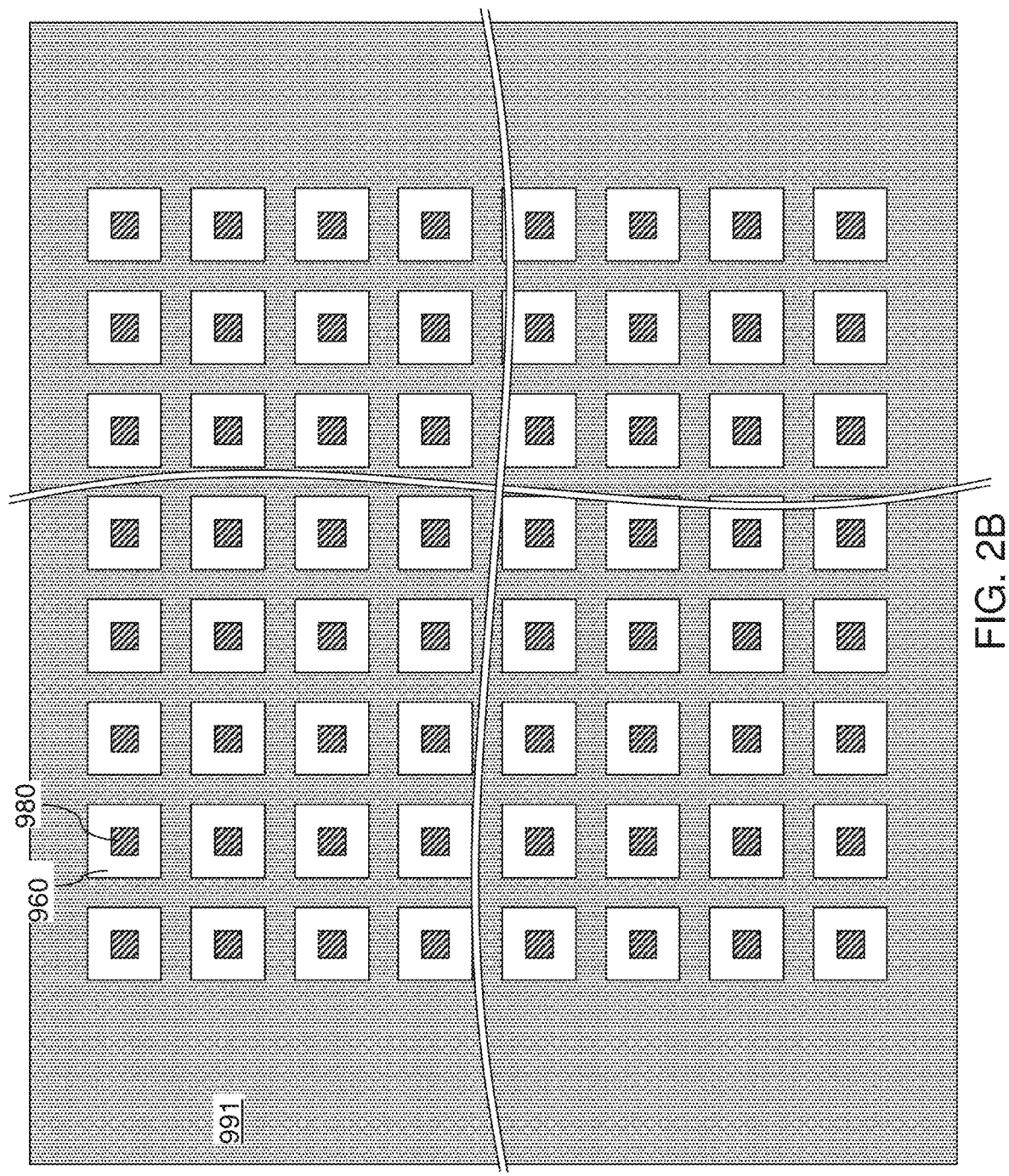

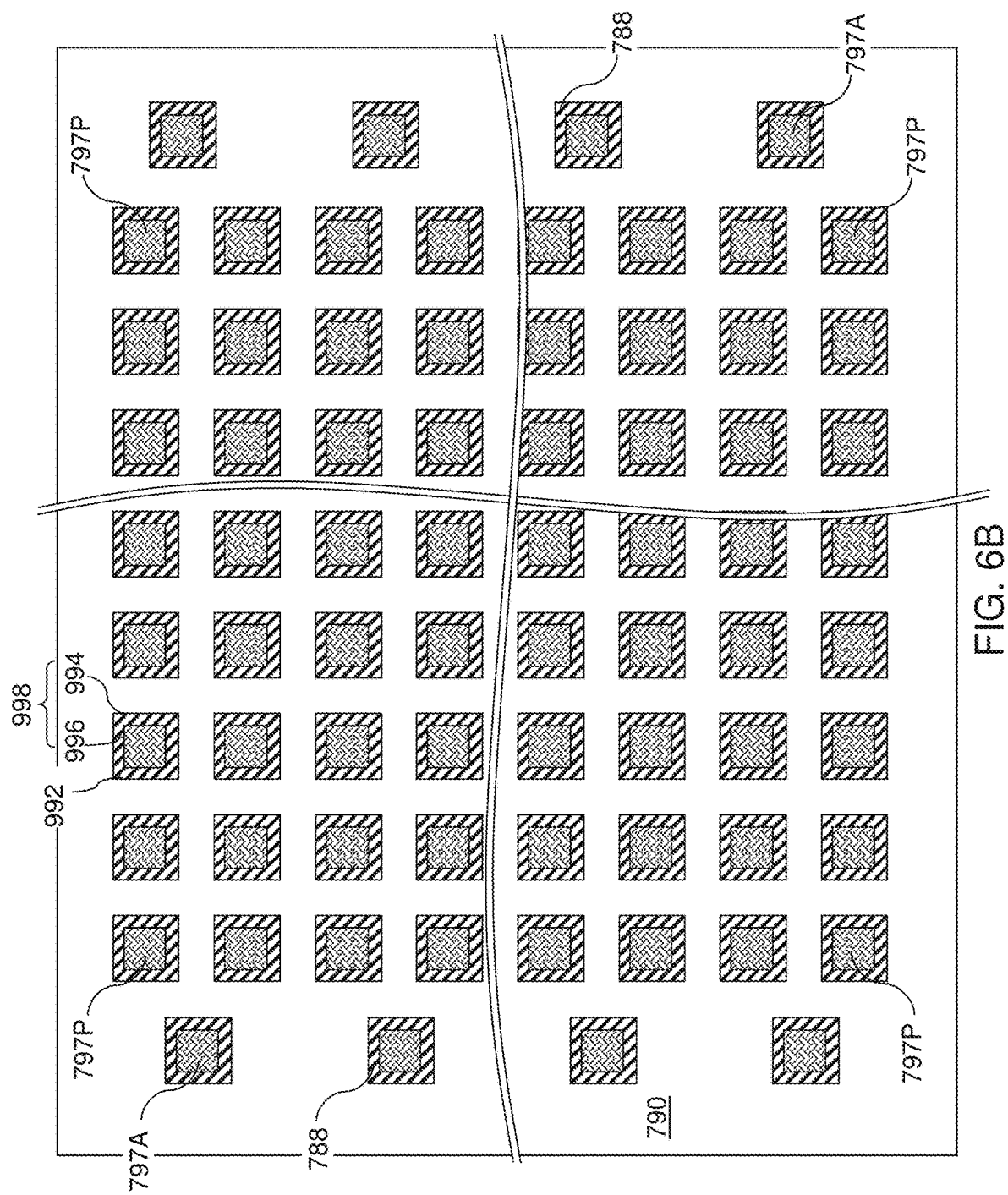

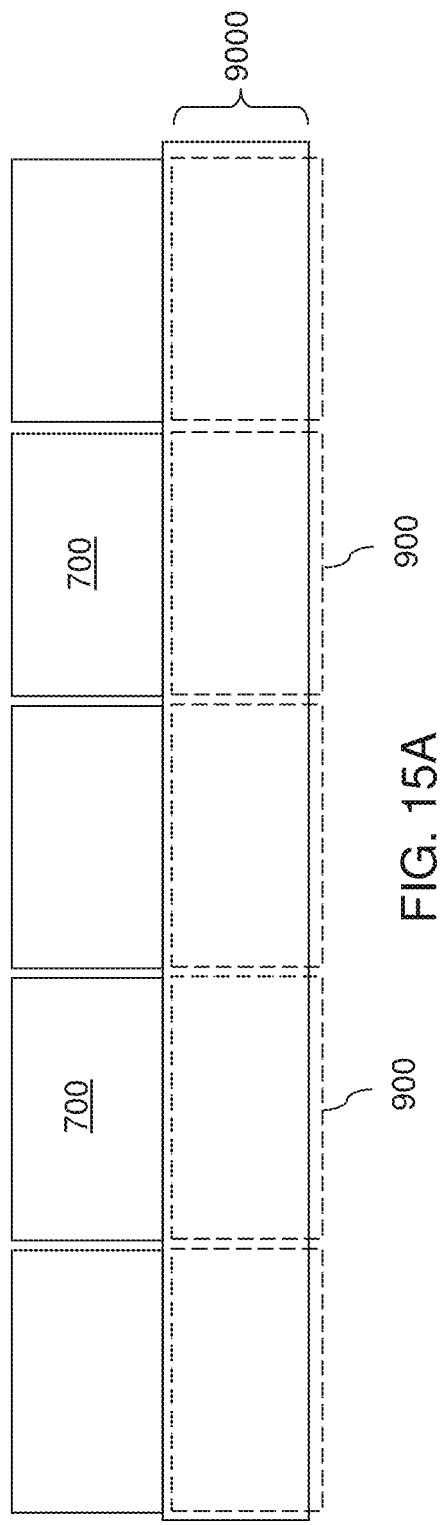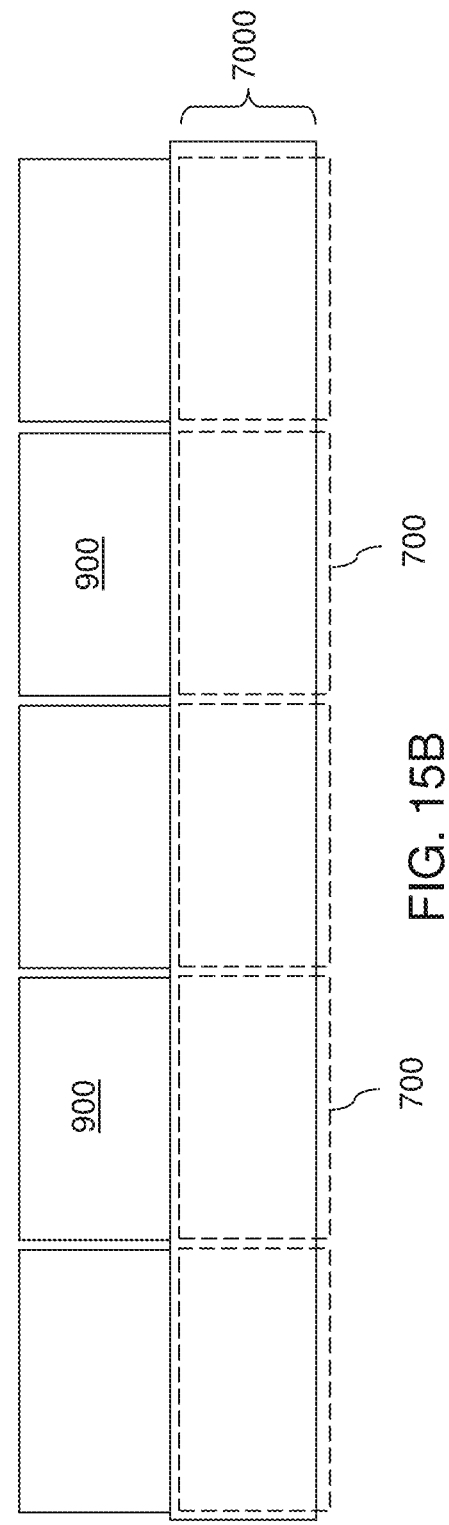

BONDED ASSEMBLY EMPLOYING METAL-SEMICONDUCTOR BONDING AND METAL-METAL BONDING AND METHODS OF FORMING THE SAME

FIELD

The present disclosure relates generally to the field of semiconductor devices, and particularly to bonded assemblies of semiconductor dies that are bonded to each other employing metal-semiconductor bonding and metal-metal bonding and methods for forming the same.

BACKGROUND

A pair of semiconductor dies may be bonded to each other to form a semiconductor chip providing the functionality of the pair of semiconductor dies with fast signal transmission therebetween. Metal-to-metal bonding may be employed to provide signal paths between the pair of semiconductor dies.

SUMMARY

According to an aspect of the present disclosure, a bonded assembly of a first semiconductor die and a second semiconductor die is provided. The first semiconductor die comprises first semiconductor devices, first metal interconnect structures embedded in first dielectric material layers, and first metal bonding pads laterally surrounded by a semiconductor material layer. The second semiconductor die comprises second semiconductor devices, second metal interconnect structures embedded in second dielectric material layers, and second metal bonding pads that comprise primary metal bonding pads and auxiliary metal bonding pads. The primary metal bonding pads are bonded to the first metal bonding pads by metal-to-metal bonding. The auxiliary metal bonding pads are bonded to the semiconductor material layer through metal-semiconductor compound portions contacting the semiconductor material layer and a respective one of the auxiliary metal bonding pads.

According to another aspect of the present disclosure, a method of forming a bonded assembly is provided. The method comprises: providing a first semiconductor die comprising first semiconductor devices, first metal interconnect structures embedded in first dielectric material layers, and first metal bonding pads laterally surrounded by a semiconductor material layer; providing a second semiconductor die comprising second semiconductor devices, second metal interconnect structures embedded in second dielectric material layers, and second metal bonding pads that comprise primary metal bonding pads and auxiliary metal bonding pads; disposing the second semiconductor die on the first semiconductor die such that the primary metal bonding pads are disposed on a respective one of the first metal bonding pads and the auxiliary metal bonding pads contact the semiconductor material layer; forming metal-semiconductor compound portions by reacting surface regions of the auxiliary metal bonding pads with surface portions of the semiconductor material layer during a first anneal process; and bonding the primary metal bonding pads to the first metal bonding pads by metal-to-metal bonding during a second anneal process after the first anneal process.

BRIEF DESCRIPTION OF THE DRAWINGS

FIG. 2B is a top-down view of the memory die of FIG. 2A.

FIG. 6B is a top-down view of the memory die of FIG. 6A.

FIG. 15A illustrates a die-to-wafer bonding scheme that may be employed to form bonded assemblies of the present disclosure.

FIG. 15B illustrates another die-to-wafer bonding scheme that may be employed to form bonded assemblies of the present disclosure.

DETAILED DESCRIPTION

Figure 1:
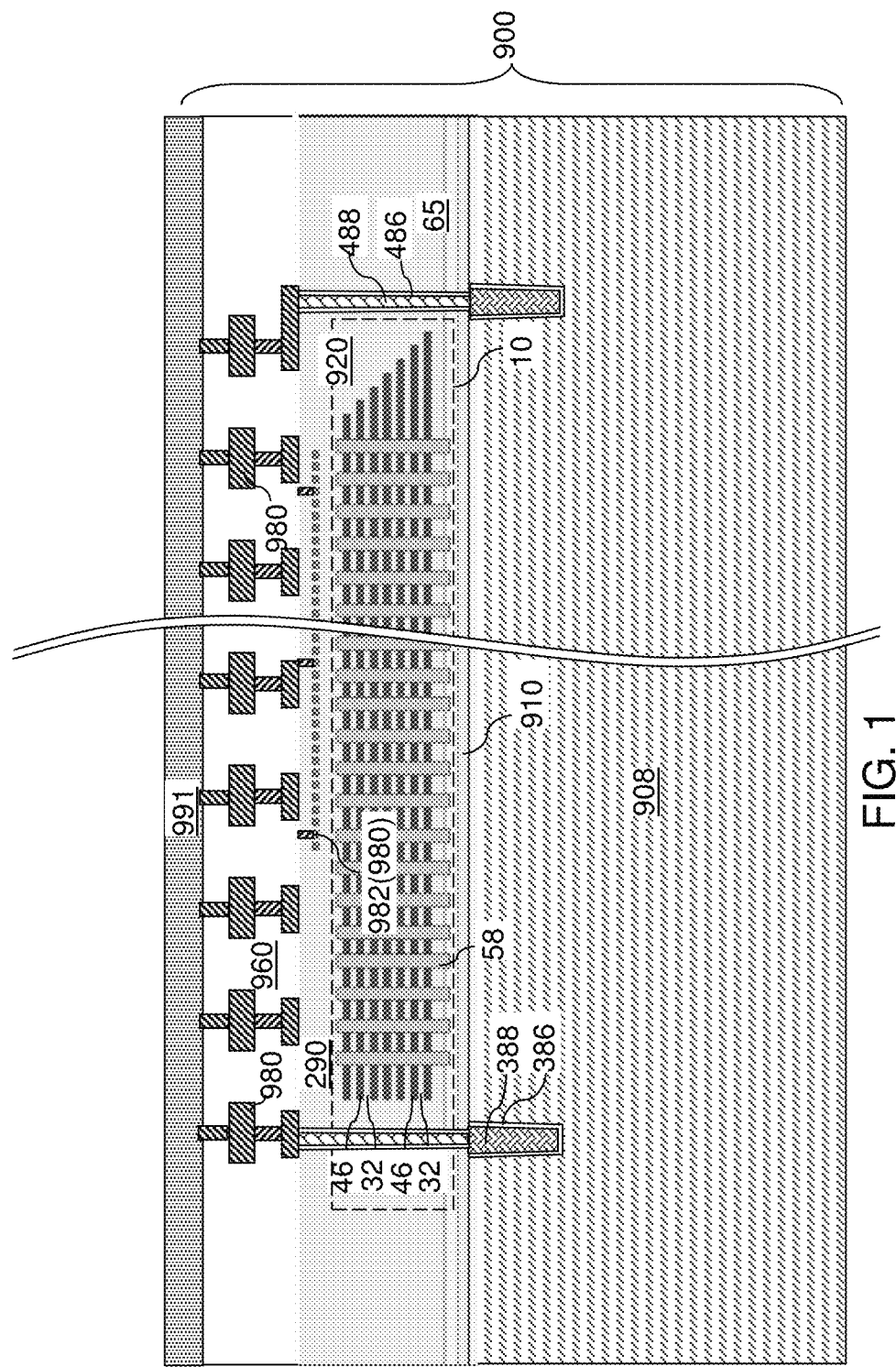
FIG. 1 is a schematic vertical cross-sectional view of a memory die after formation of a semiconductor material layer over first dielectric material layers according to an embodiment of the present disclosure.

As discussed above, the present disclosure is directed to bonded assemblies of semiconductor dies that are bonded to each other employing metal-semiconductor bonding to form silicide bonds and metal-metal bonding to form metal bonds and methods for forming the same, the various aspects of which are incorporated herein by reference.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

As used herein, a "memory level" or a "memory array level" refers to the level corresponding to a general region between a first horizontal plane (i.e., a plane parallel to the top surface of the substrate) including topmost surfaces of an array of memory elements and a second horizontal plane including bottommost surfaces of the array of memory elements. As used herein, a "through-stack" element refers to an element that vertically extends through a memory level.

As used herein, a "semiconducting material" refers to a material having electrical conductivity in the range from $1.0\times10^{-5}$ S/m to $1.0\times10^{5}$ S/m. As used herein, a "semiconductor material" refers to a material having electrical conductivity in the range from $1.0\times10^{-5}$ S/m to 1.0 S/m in the absence of electrical dopants therein, and is capable of producing a doped material having electrical conductivity in a range from 1.0 S/m to $1.0\times10^{5}$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0\times10^{5}$ S/m. As used herein, an "insulator material" or a "dielectric material" refers to a material having electrical conductivity less than $1.0\times10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0\times10^{5}$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0\times10^{-5}$ S/m to $1.0\times10^{5}$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material may be semiconducting or conductive depending on the atomic concentration of electrical dopants therein. As used herein, a "metallic material" refers to a conductive material including at least one metallic element therein. All measurements for electrical conductivities are made at the standard condition.

The various three-dimensional memory devices of the present disclosure include a monolithic three-dimensional NAND string memory device, and may be fabricated using the various embodiments described herein. The monolithic three-dimensional NAND string is located in a monolithic, three-dimensional array of NAND strings located over the substrate. At least one memory cell in the first device level of the three-dimensional array of NAND strings is located over another memory cell in the second device level of the three-dimensional array of NAND strings.

Generally, a semiconductor package (or a "package") refers to a unit semiconductor device that may be attached to a circuit board through a set of pins or solder balls. A semiconductor package may include a semiconductor chip (or a "chip") or a plurality of semiconductor chips that are bonded throughout, for example, by flip-chip bonding or another chip-to-chip bonding. A package or a chip may include a single semiconductor die (or a "die") or a plurality of semiconductor dies. A die is the smallest unit that may independently execute external commands or report status. Typically, a package or a chip with multiple dies is capable of simultaneously executing as many external commands as the total number of planes therein. Each die includes one or more planes. Identical concurrent operations may be executed in each plane within a same die, although there may be some restrictions. In case a die is a memory die, i.e., a die including memory elements, concurrent read operations, concurrent write operations, or concurrent erase operations may be performed in each plane within a same memory die. In a memory die, each plane contains a number of memory blocks (or "blocks"), which are the smallest unit that may be erased by in a single erase operation. Each memory block contains a number of pages, which are the smallest units that may be selected for programming. A page is also the smallest unit that may be selected to a read operation.

Referring to FIG. 1, a memory die 900 is illustrated. The memory die 900 includes a memory-side substrate 908, memory-side semiconductor devices 920 overlying the memory-side substrate 908, memory-side interconnect-level dielectric material layers (290, 960) located on the memory-side semiconductor devices, and memory-side metal interconnect structures 980 embedded in the memory-side interconnect-level dielectric material layers (290, 960). In one embodiment, the memory-side substrate 908 may be a memory-side substrate such as a commercially available silicon wafer having a thickness in a range from 500 microns to 1 mm.

Discrete substrate recess cavities can be formed in an upper portion of the memory-side substrate 908 by applying a photoresist layer over the top surface of the memory-side substrate 908, lithographically patterning the photoresist layer to form an array of discrete openings, and transferring the pattern of the array of discrete openings into the upper portion of the memory-side substrate by performing an anisotropic etch process. The photoresist layer can be subsequently removed, for example, by ashing. The depth of each discrete substrate recess cavity can be in a range from 500 nm to 10,000, although lesser and greater depths can also be employed. A through-substrate liner 386 and a through-substrate via structure 388 can be formed within each discrete substrate recess cavity.

Generally, the memory-side semiconductor devices 920 may comprise any semiconductor device known in the art. In one embodiment, the memory die 900 comprises a memory die, and may include memory devices, such as a three-dimensional NAND memory device. In an illustrative example, the memory-side semiconductor devices 920 may include a vertically alternating stack of insulating layers 32 and electrically conductive layers 46, and a two-dimensional array of memory openings vertically extending through the vertically alternating stack (32, 46). The electrically conductive layers 46 may comprise word lines of the three-dimensional NAND memory device.

A memory opening fill structure 58 may be formed within each memory opening. A memory opening fill structure 58 may include a memory film and a vertical semiconductor channel contacting the memory film. The memory film may include a blocking dielectric, a tunneling dielectric and a charge storage material located between the blocking and tunneling dielectric. The charge storage material may comprise charge trapping layer, such as a silicon nitride layer, or a plurality of discrete charge trapping regions, such as floating gates or discrete portions of a charge trapping layer. In this case, each memory opening fill structure 58 and adjacent portions of the electrically conductive layers 46 constitute a vertical NAND string. Alternatively, the memory opening fill structures 58 may include any type of non-volatile memory elements such as resistive memory elements, ferroelectric memory elements, phase change memory elements, etc. The memory device may include an optional horizontal semiconductor channel layer 10 connected to the bottom end of each vertical semiconductor channel, and an optional dielectric spacer layer 910 that provides electrical isolation between the memory-side substrate 908 and the horizontal semiconductor channel layer 10.

The electrically conductive layers 46 may be patterned to provide a terrace region in which each overlying electrically conductive layer 46 has a lesser lateral extent than any underlying electrically conductive layer 46. Contact via structures (not shown) may be formed on the electrically conductive layers 46 in the terrace region to provide electrical connection to the electrically conductive layers 46. Dielectric material portions 65 may be formed around each vertically alternating stack (32, 46) to provide electrical isolation between neighboring vertically alternating stacks (32, 46).

Through-memory-level via cavities can be formed through the dielectric material portions 65, the optional dielectric spacer layer 910, and the horizontal semiconductor channel layer 10. An optional through-memory-level dielectric liner 486 and a through-memory-level via structure 488 can be formed within each through-memory-level via cavity. Each through-memory-level dielectric liner 486 includes a dielectric material such as silicon oxide. Each through-memory-level via structure 488 can be formed directly on a respective one of the through-substrate via structure 388.

The memory-side interconnect-level dielectric material layers (290, 960) may include memory-side proximal interconnect-level dielectric material layers 290 embedding contact via structures and bit lines 982 and memory-side distal interconnect-level dielectric material layers 960 that embed a subset of the memory-side metal interconnect structures 980 located above the memory-side proximal interconnect-level dielectric material layers 290. As used herein, a "proximal" surface refers to a surface that is close to a substrate, and a "distal" surface refers to a surface that is distal from the substrate. In the memory die 900, a proximal surface refers to a surface that is close to the memory-side substrate 908, and a distal surface refers to a surface that is distal from the memory-side substrate 908.

The bit lines 982 are a subset of the memory-side metal interconnect structures 980 and may electrically contact drain regions located above the semiconductor channel at the top of the memory opening fill structures 58. The contact via structures contact various nodes of the memory-side semiconductor devices. Generally, the memory-side metal interconnect structures 980 can be electrically connected to the memory-side semiconductor devices 920. A proximal subset of the memory-side metal interconnect structures 980 can be located within the memory-side distal interconnect-level dielectric material layers 960. Interconnect metal lines and interconnect metal via structures, which are subsets of the memory-side metal interconnect structures 980, can be embedded in the memory-side distal interconnect-level dielectric material layers 960. In an illustrative example, the memory-side metal interconnect structures 980 may include multiple memory-side metal line levels and multiple memory-side metal via levels.

Each of the memory-side proximal interconnect-level dielectric material layers 290 and the memory-side distal interconnect-level dielectric material layers 960 may include a dielectric material such as undoped silicate glass, a doped silicate glass, organosilicate glass, silicon nitride, a dielectric metal oxide, or a combination thereof. The memory-side distal interconnect-level dielectric material layers 960 may include one or more dielectric diffusion barrier liners (not expressly shown). In this case, each dielectric diffusion barrier liner embedded in the memory-side distal interconnect-level dielectric material layers 960 may include silicon carbon nitride (i.e., silicon carbonitride "SiCN", which is also referred to silicon carbide nitride), silicon nitride ($Si_3N_4$), silicon oxynitride, or any other dielectric material that is effective in blocking diffusion of copper. In one embodiment, each dielectric diffusion barrier liner embedded in the memory-side distal interconnect-level dielectric material layers 960 may include a dielectric material having a dielectric constant less than 5, such as SiCN having a dielectric constant of about 3.8, to reduce RC delay of the memory-side metal interconnect structures 980. Each dielectric diffusion barrier liner may have a thickness in a range from 10 nm to 30 nm.

A semiconductor material layer 991 can be deposited over the top surface of the memory-side interconnect-level dielectric material layers (290, 960). The semiconductor material layer 991 includes a semiconductor material that can form a metal-semiconductor compound upon reaction with a metallic element. For example, the semiconductor material layer 991 may include silicon, germanium, and/or a compound semiconductor material that can form a metal-semiconductor alloy when a metal is disposed thereupon and is subjected to an elevated temperature. In an illustrative example, the semiconductor material layer 991 may comprise, and/or may consist essentially of, amorphous silicon, polysilicon, germanium, or a silicon-germanium alloy, which can form a metal silicide, metal germanide or metal silicide-germanide metal-semiconductor alloy. The semiconductor material layer 991 may be formed by chemical vapor deposition or physical vapor deposition. The thickness of the semiconductor material layer 991 may be in a range from 100 nm to 2,000 nm, such as from 200 nm to 1,000 nm, although lesser and greater thicknesses may also be employed.

The semiconductor die on which a semiconductor material layer 991 is deposited is referred to herein as a first semiconductor die. The semiconductor devices located within the first semiconductor die are referred to as first semiconductor devices. The dielectric material layers located within the first semiconductor die are referred to as first dielectric material layers. The metal interconnect structures located within the first semiconductor die are referred to as first metal interconnect structures. In the case of the memory die 900 illustrated in FIG. 1, the memory die 900 constitutes a first semiconductor die. The memory-side semiconductor devices 920 are referred to as first semiconductor devices. The memory-side interconnect-level dielectric material layers (290, 960) constitute first dielectric material layers. The memory-side metal interconnect structures 980 constitute first metal interconnect structures.

Figure 2A:
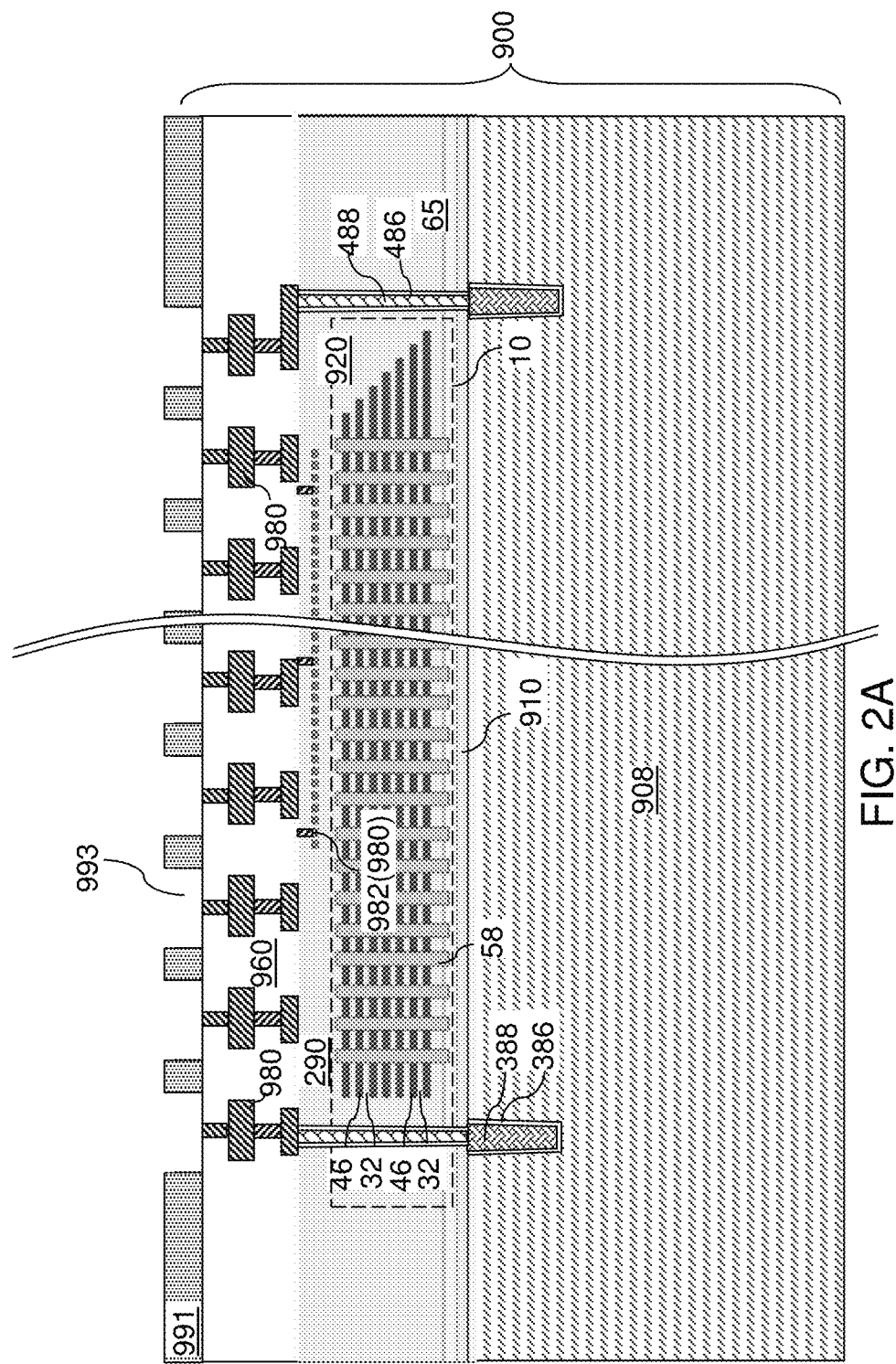
FIG. 2A is a schematic vertical cross-sectional view of the memory die after formation of first pad cavities according to an embodiment of the present disclosure.

Referring to FIGS. 2A and 2B, a photoresist layer (not shown) can be applied over the semiconductor material layer 991, and can be lithographically patterned to form an array of openings therein. Each opening in the photoresist layer may have a horizontal cross-sectional shape of a circle, an ellipse, a rectangle, a rounded rectangle, or any generally two-dimensional curvilinear shape having a closed periphery. In one embodiment, the array of openings in the photoresist layer may comprise a periodic array of openings. In one embodiment, the array of openings in the photoresist layer may comprise a rectangular periodic array of openings having a first pitch along a first horizontal direction and having a second pitch along a second horizontal direction. The first pitch may be in a range from 1 micron to 100 microns, such as from 3 microns to 30 microns, and the second pitch may be in a range from 1 micron to 100 microns, such as from 3 micron to 30 microns, although lesser and greater dimensions may also be employed. The lateral dimension of each opening in the photoresist layer (such as a diameter of a circular opening, a semimajor axis of an elliptical opening, or a side of a square or rectangular opening) may be in a range from 500 nm to 50 microns, such as from 1 micron to 25 microns, although lesser and greater dimensions may also be employed.

An etch process, such as an anisotropic etch process, can be performed to transfer the pattern of the openings in the photoresist layer through at least the semiconductor material layer 991 and optionally into an upper portion of the distal memory-side interconnect-level dielectric material layers 960. First pad cavities 993 can be formed underneath the openings in the photoresist layer through the semiconductor material layer 991 and optionally through an upper portion of the distal memory-side interconnect-level dielectric material layers 960. The depth of each first pad cavity 993 may be in a range from 100 nm to 5,000 nm, such as from 200 nm to 2,000 nm, although lesser and greater depths may also be employed. The photoresist layer can be subsequently removed, for example, by ashing.

Figure 3:
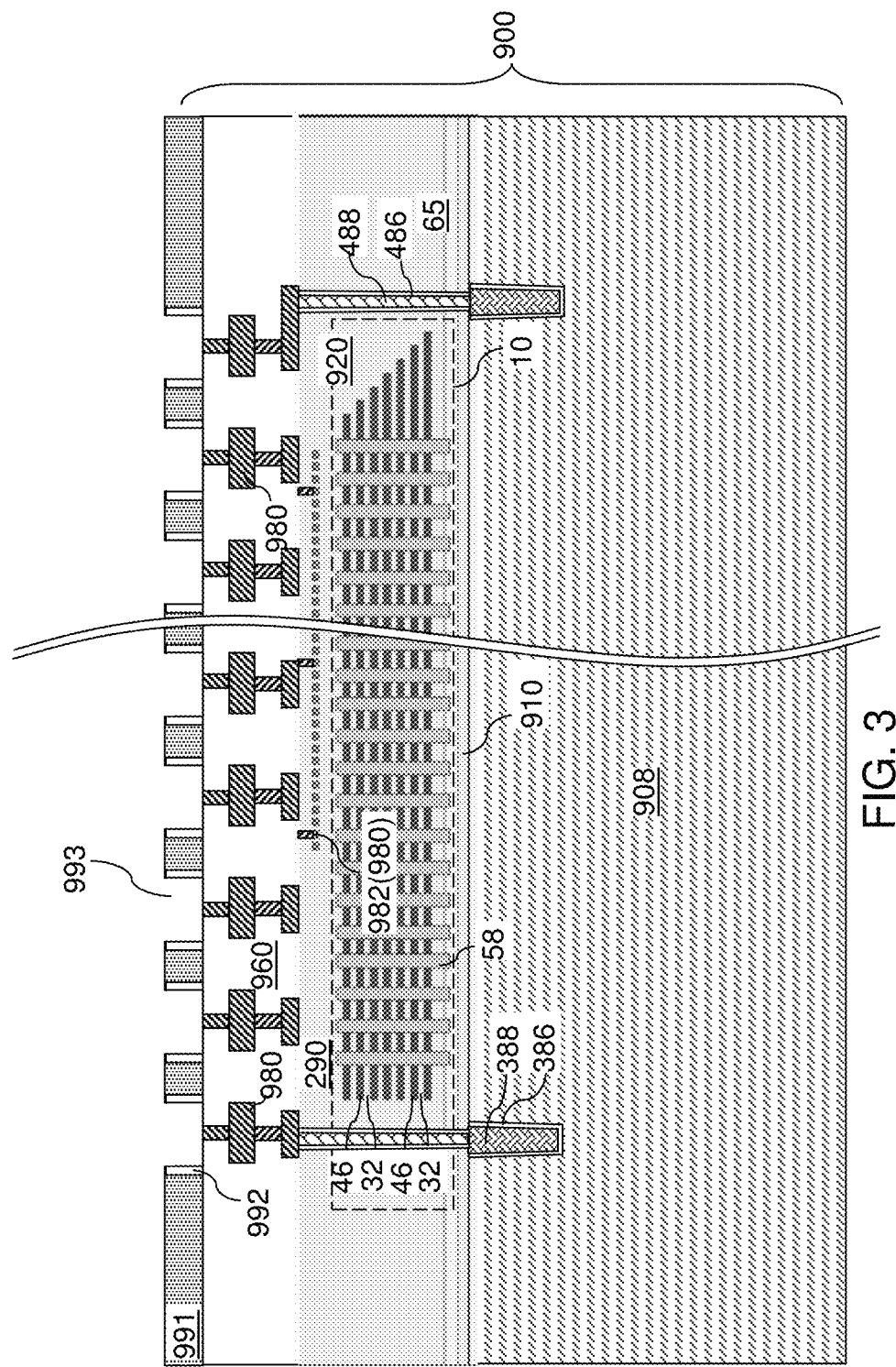
FIG. 3 is a schematic vertical cross-sectional view of the memory die after formation of dielectric spacers according to an embodiment of the present disclosure.

Referring to FIG. 3, a dielectric material layer can be formed over the semiconductor material layer 991 by conformal deposition of a dielectric material. In an illustrative example, a low temperature silicon oxide (e.g., undoped silicate glass) may be deposited over the semiconductor material layer 991 by plasma-enhanced chemical vapor deposition. Alternatively, silicon nitride or silicon oxynitride may be conformally deposited over the semiconductor material layer 991 to form the dielectric material layer.

An anisotropic sidewall spacer etch process can be performed to remove horizontally-extending portions of the dielectric material layer. Each vertically-extending portion of the dielectric material layer that lines sidewalls of the semiconductor material layer 991 constitute dielectric spacers (i.e., sidewall spacers) 992. The lateral thickness of each dielectric spacer 992 (as measured between an inner sidewall and an outer sidewall) may be in a range from 30 nm to 300 nm, although lesser and greater thicknesses may also be employed.

Figure 4:
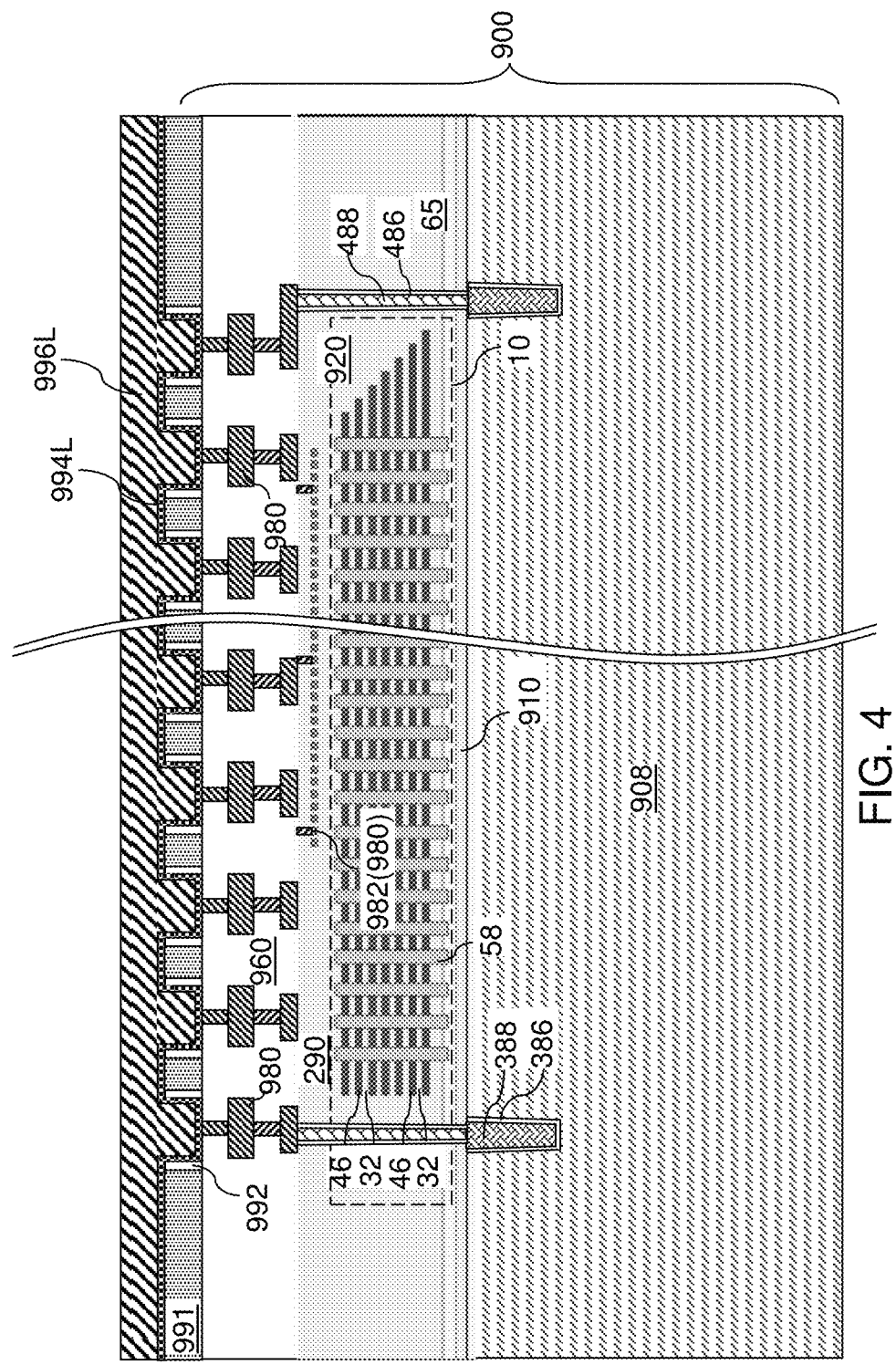
FIG. 4 is a schematic vertical cross-sectional view of the memory die after deposition of at least one metallic pad material layer according to an embodiment of the present disclosure.

Referring to FIG. 4, at least one metallic pad material layer (994L, 996L) can be deposited in remaining volumes of the first pad cavities 993 and over the semiconductor material layer 991. The at least one metallic pad material layer (994L, 996L) may include, for example, a metallic barrier liner layer 994L and a metallic bonding material layer 996L.

The optional metallic barrier liner layer 994L includes a metallic barrier material that blocks diffusion of hydrogen and impurity materials. For example, the metallic barrier liner layer 994L may include TiW, TiN, TaN, WN, TiC, TaC, WC, or a combination thereof. The metallic barrier liner layer 994L may be deposited by physical vapor deposition or chemical vapor deposition, and may have a thickness in a range from 10 nm to 100 nm, although lesser and greater thicknesses may also be employed. Optionally, the metallic barrier material may include a seed layer coating on its outer surface. The seed layer may comprise copper or nickel.

The metallic bonding material layer 996L includes a metallic material that can provide metal-to-metal bonding upon reaction with another metal. For example, the metallic bonding material layer 996L may comprise nickel, cobalt, molybdenum, platinum, alloys thereof, or a material stack thereof. In one embodiment, the metallic bonding material layer 996L may comprise nickel at an atomic percentage greater than 95%, and/or greater than 98%, and/or greater than 99%. The metallic bonding material layer 996L can be deposited by physical vapor deposition, electroplating, electroless plating, chemical vapor deposition, or a combination thereof. If the metallic bonding material layer 996L comprises nickel, then it may be deposited by plating on a copper or nickel seed layer coating on the metallic barrier liner layer 994L.

Figure 5A:
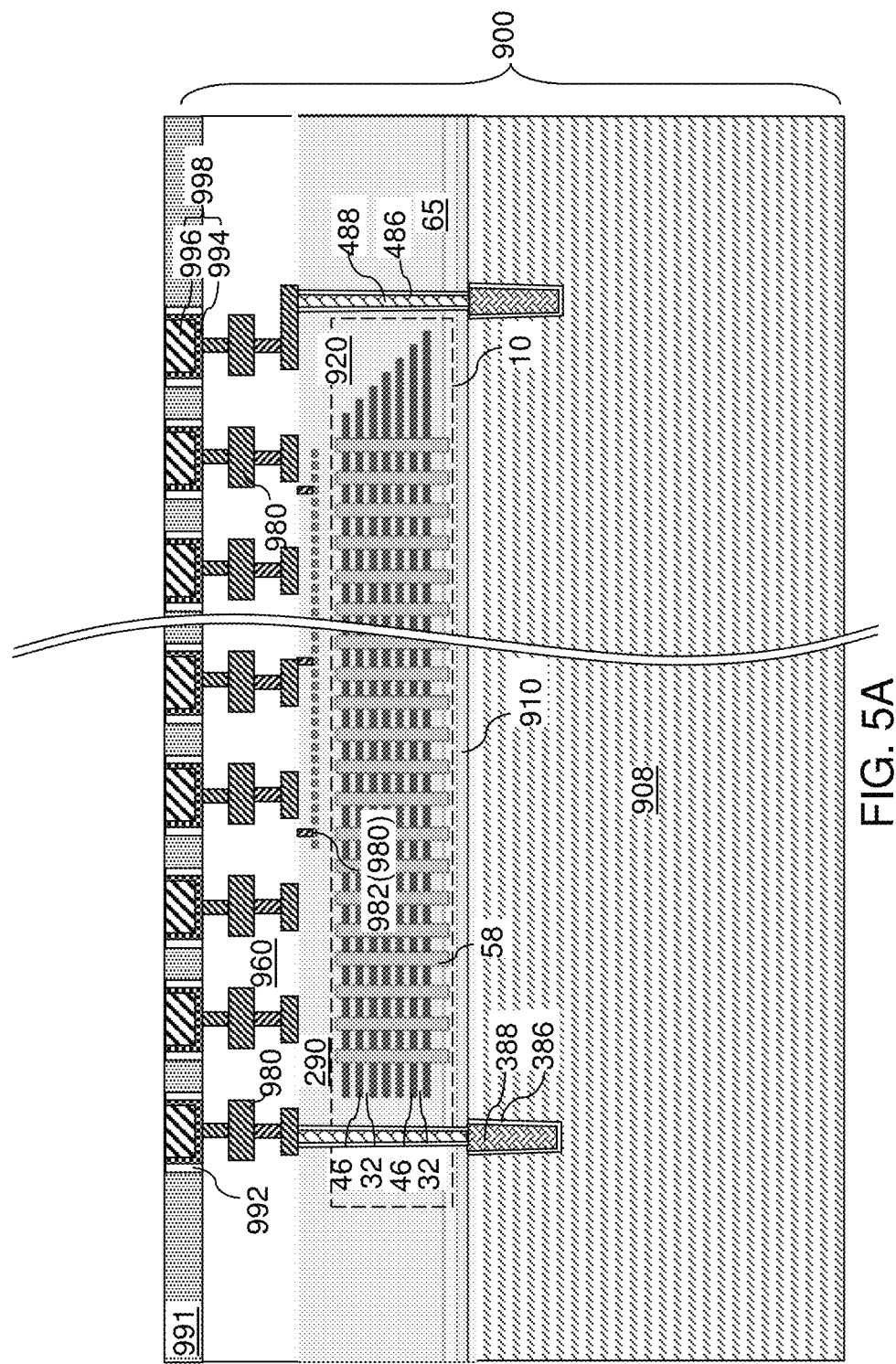
FIG. 5A is a schematic vertical cross-sectional view of the memory die after formation of first bonding pads according to an embodiment of the present disclosure.
Figure 5B:
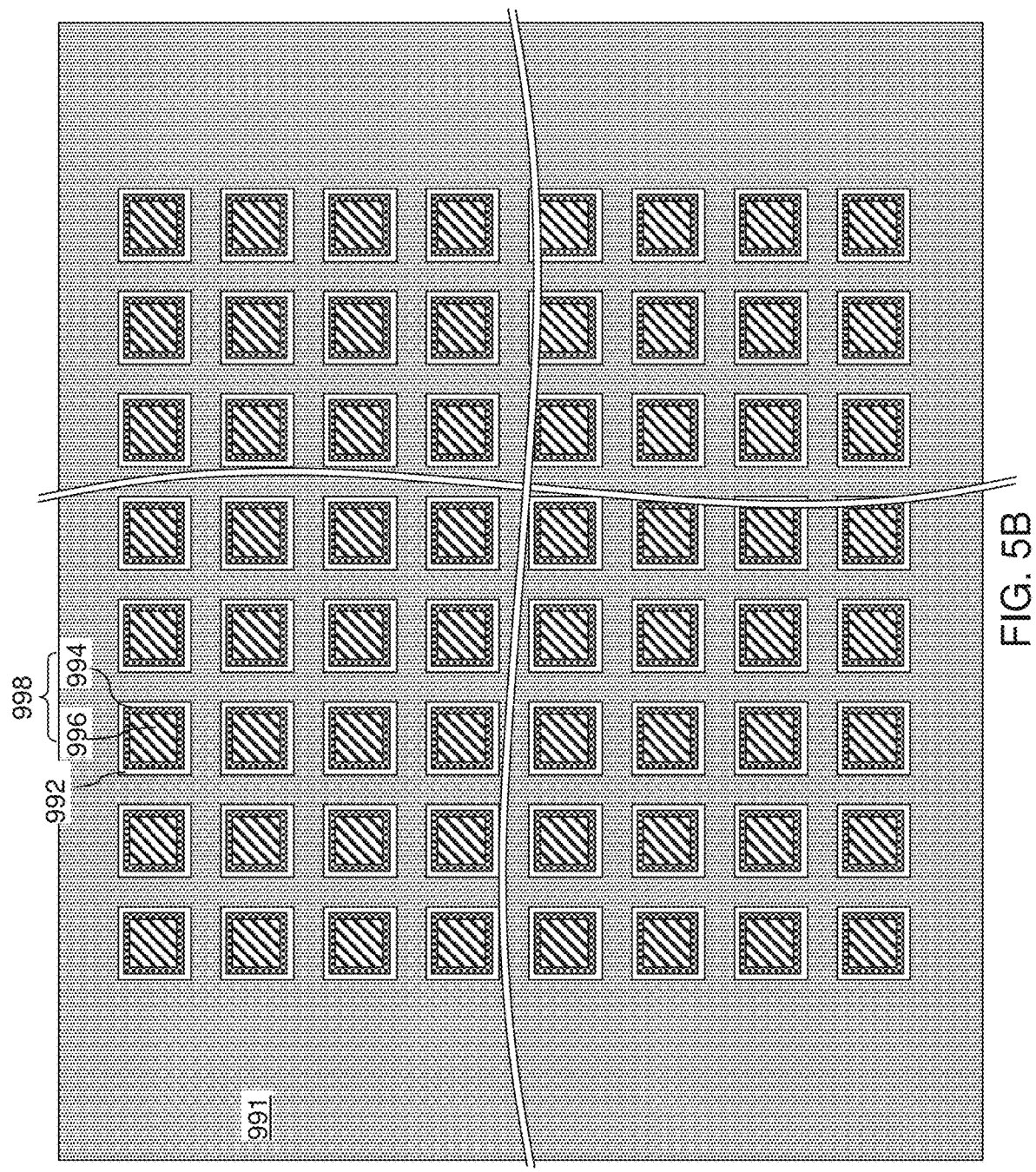
FIG. 5B is a top-down view of the memory die of FIG. 5A.

Referring to FIGS. 5A and 5B, portions of the at least one metallic pad material layer (994L, 996L) overlying the top surface of the semiconductor material layer 991 can be removed by a planarization process, which may employ a chemical mechanical polishing (CMP) process and/or a recess etch process. Each remaining material portion of the at least one metallic pad material layer (994L, 996L) that fills the volume of a respective one of the first pad cavities 993 constitutes a first metal bonding pad 998. Each first metal bonding pad 998 can include an optional respective metallic barrier liner 994 which is a patterned portion of the metallic barrier liner layer 994L, and can include a metallic bonding material portion 996 which is a patterned portion of the metallic bonding material layer 996L.

In one embodiment, each of the first metal bonding pads 998 can be electrically isolated from the semiconductor material layer 991 and can be laterally surrounded by the respective dielectric spacer 992. In one embodiment, each of the metallic bonding material portion 996 may be a nickel-containing portion that contains nickel at an atomic percentage greater than 90%, and/or greater than 95%, and/or greater than 98%, and/or greater than 99%. In one embodiment, each of the first metal bonding pads 998 comprises a metallic barrier liner 994 comprising a conductive metallic nitride material or a tungsten-containing material, such as TiW, and surrounding a respective nickel-containing portion (i.e., the metallic bonding material portion 996) on the bottom and sides.

Figure 6A:
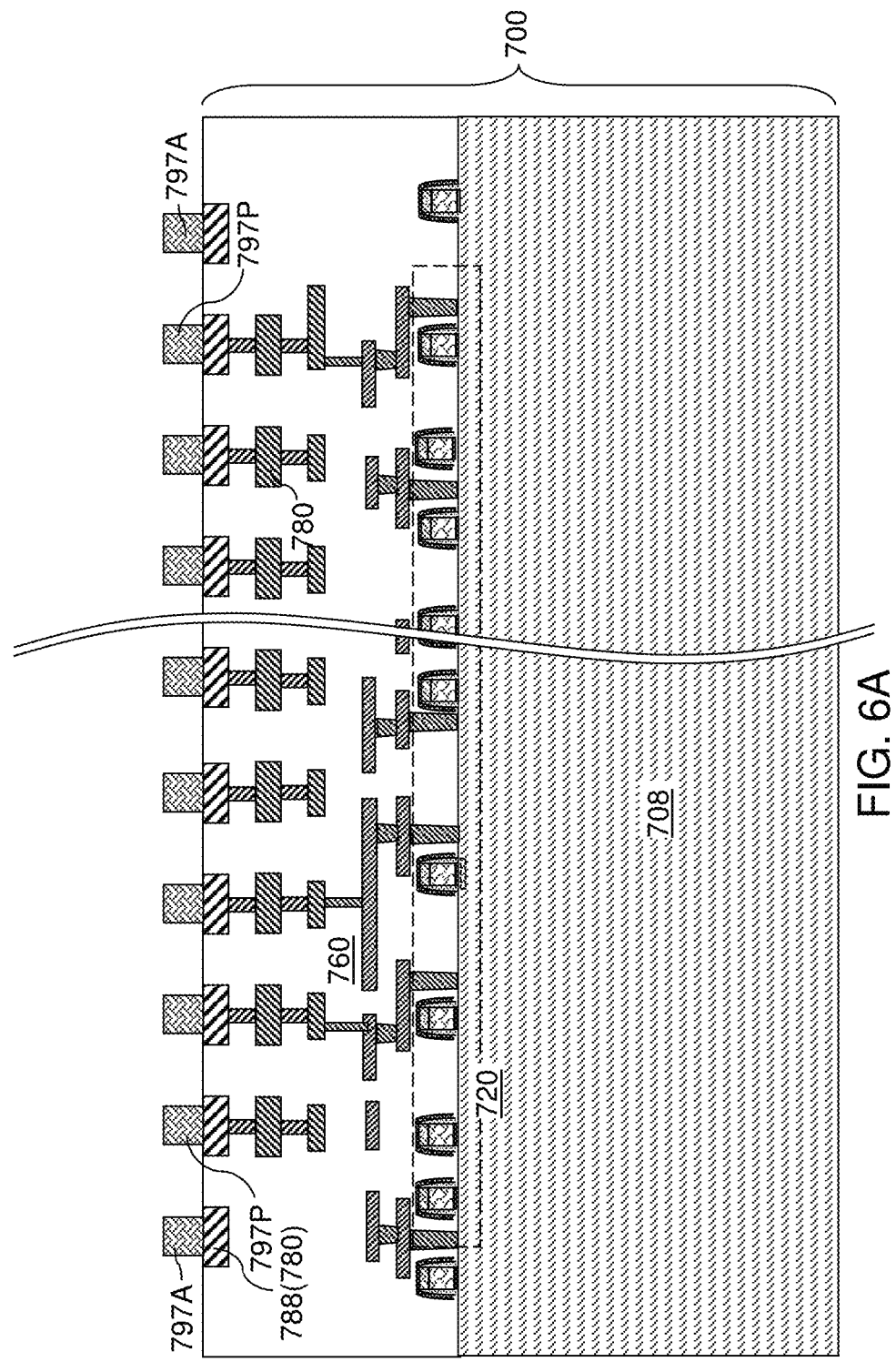
FIG. 6A is a schematic vertical cross-sectional view of a logic die after formation of second bonding pads according to an embodiment of the present disclosure.

Referring to FIGS. 6A and 6B, a logic die 700 according to an embodiment of the present disclosure is illustrated. The logic die 700 includes a logic-side substrate 708, logic-side semiconductor devices 720 overlying the logic-side substrate 708, logic-side interconnect-level dielectric material layers 760 overlying the logic-side semiconductor devices 720, and logic-side metal interconnect structures 780 embedded in the logic-side interconnect-level dielectric material layers 760. In one embodiment, the logic-side semiconductor devices 720 may include at least one complementary metal oxide semiconductor (CMOS) peripheral circuitry for operation of memory devices. In one embodiment, the logic-side substrate 708 may be a logic-side substrate such as a commercially available silicon substrate having a thickness in a range from 500 microns to 1 mm.

Generally, the logic-side semiconductor devices may comprise any semiconductor device that may be operated in conjunction with the memory-side semiconductor devices in the memory die 900 to provide enhanced functionality. In one embodiment, the logic die 700 comprises a support circuitry (i.e., a peripheral circuitry) configured for controlling operation of memory devices (such as a three-dimensional array of memory elements) within the memory die 900. In one embodiment, the memory die 900 may include a three-dimensional memory device including a three-dimensional array of memory elements, word lines (that may comprise a subset of the electrically conductive layers 46), and bit lines 982, and the logic-side semiconductor devices 720 of the logic die 700 may include a peripheral circuitry for operation of the three-dimensional array of memory elements. The peripheral circuitry may include one or more word line driver circuits that drive the word lines of the three-dimensional array of memory elements of the memory die 900, one or more bit line driver circuits that drive the bit lines 982 of the memory die 900, one or more word line decoder circuits that decode the addresses for the word lines, one or more bit line decoder circuits that decode the addresses for the bit lines 982, one or more sense amplifier circuits that sense the states of memory elements within the memory opening fill structures 58 of the memory die 900, a source power supply circuit that provides power to the horizontal semiconductor channel layer 10 in the memory die 900, a data buffer and/or latch, and/or any other semiconductor circuit that may be used to operate three-dimensional memory device of the memory die 900.

The logic-side interconnect-level dielectric material layers 760 may include a dielectric material such as undoped silicate glass (e.g., silicon oxide), a doped silicate glass, organosilicate glass, silicon nitride, a dielectric metal oxide, or a combination thereof. The logic-side metal interconnect structures 780 includes various metal line structures and various metal via structures. In one embodiment, the logic-side metal interconnect structures 780 may include optional metallic connection pad structures 788 located at a topmost level of the logic-side interconnect-level dielectric material layers 760. A first subset of the metallic connection pad structures 788 may be arranged in a mirror image pattern of the pattern of the first metal bonding pads 998 in the memory die 900. A second subset of the metallic connection pad structures 788 may be located around the first subset of the metallic connection pad structures 788 and/or at peripheral regions of the topmost level of the logic-side interconnect-level dielectric material layers 760 that are proximal to the edges or corners of the logic die 700. Alternatively, the metallic connection pad structures 788 may be omitted.

A semiconductor die to be bonded with a first semiconductor die is referred to herein as a second semiconductor die. The semiconductor devices located within the second semiconductor die are referred to as second semiconductor devices. The dielectric material layers located within the second semiconductor die are referred to as second dielectric material layers. The metal interconnect structures located within the second semiconductor die are referred to as second metal interconnect structures. In the case of the logic die 700 illustrated in FIGS. 6A and 6B, the logic die 700 constitutes a second semiconductor die. The logic-side semiconductor devices 720 are referred to as second semiconductor devices. The logic-side interconnect-level dielectric material layers 760 constitute second dielectric material layers. The logic-side metal interconnect structures 780 constitute second metal interconnect structures.

According to an aspect of the present disclosure, a metallic material that can react with the semiconductor material of the semiconductor material layer 991 to form a metal-semiconductor alloy is deposited over the topmost surface of the logic-side interconnect-level dielectric material layers 760 and on the top surfaces of the logic-side metal interconnect structures 780 (e.g., on the top surfaces of the metallic connection pad structures 788 if they are present). Generally, the metallic material may include, or may consist essentially of, any metal that can form a metal-semiconductor alloy upon reaction with the semiconductor material of the semiconductor material layer 991. Preferably, the metallic material may include, or may consist essentially of, any metal that can form a metal-semiconductor alloy at a temperature of 500 degrees Celsius or below. In one embodiment, the semiconductor material layer 991 comprises silicon, and the deposited metallic material may include at least one silicide-forming transition metal at an atomic percentage greater than 90%. For example, the at least one silicide-forming transition metal comprises, and/or consists essentially of, at least one element selected from Ni, Co, Pt, or Mo. In an illustrative example, the deposited metallic material may comprise nickel at an atomic percentage greater than 90%, such as 90 to 900%. The metallic material may be deposited by physical vapor deposition, plating and/or chemical vapor deposition. The thickness of the metallic material may be in a range from 100 nm to 2,000 nm, although lesser and greater thicknesses may also be employed.

A photoresist layer (not shown) can be applied over the layer of the deposited metallic material, and can be lithographically patterned into discrete photoresist material portions. The pattern of the discrete photoresist material portions may include a first sub-pattern that is a mirror image pattern of the first metal bonding pads 998 and a second sub-pattern that that is interlaced with, or is located outside of, the first sub-pattern. In one embodiment, the lateral dimensions of each of the discrete photoresist material portions within the first sub-pattern may be less than the lateral dimension of each first metal bonding pad 998.

An etch process can be performed to transfer the pattern of the discrete photoresist material portions through the layer of the metallic material. An anisotropic etch process or an isotropic etch process may be performed to pattern the layer of the metallic material. Discrete patterned portions of the layer of the metallic material constitute second metal bonding pads (797P, 797A).

The second metal bonding pads (797P, 797A) comprise primary metal bonding pads 797P and auxiliary metal bonding pads 797A. The primary metal bonding pads 797P can be arranged in a pattern that is a mirror image pattern of the first metal bonding pads 998. The auxiliary metal bonding pads 797A can be interlaced with the primary metal bonding pads 797P and/or can be located at peripheral regions of the primary metal bonding pads 797P. The thickness of the second metal bonding pads (797P, 797A) may be in a range from 100 nm to 2,000 nm, although lesser and greater thicknesses may also be employed.

The metal bonding pads 797P and the auxiliary metal bonding pads 797A may have the same material composition which is a metallic composition (i.e., they may comprise a metal or metal alloy). In one embodiment, the metal bonding pads 797P and the auxiliary metal bonding pads 797A comprise, and/or consist essentially of, at least one transition metal element, such as Ni, Co, Pt or Mo that forms that forms the metal silicide material upon reaction with silicon. In one embodiment, the primary metal bonding pads 797P and the auxiliary metal bonding pads 797A comprise, and/or consist essentially of, a silicide-forming transition metal element at an atomic percentage greater than 90%, and/or greater than 95%, and/or greater than 98%, and/or greater than 99%, and/or at 100%.

According to an embodiment of the present disclosure, the primary metal bonding pads 797P can be electrically connected to nodes of the logic-side semiconductor devices 720, and the auxiliary metal bonding pads 797A are electrically floating, and thus, are electrically isolated from the logic-side semiconductor devices 720. In other words, the auxiliary metal bonding pads 797A are dummy bonding pads that are used for mechanical bonding but are not electrically connected to various interconnects 780 or semiconductor devices 720.

Figure 7:
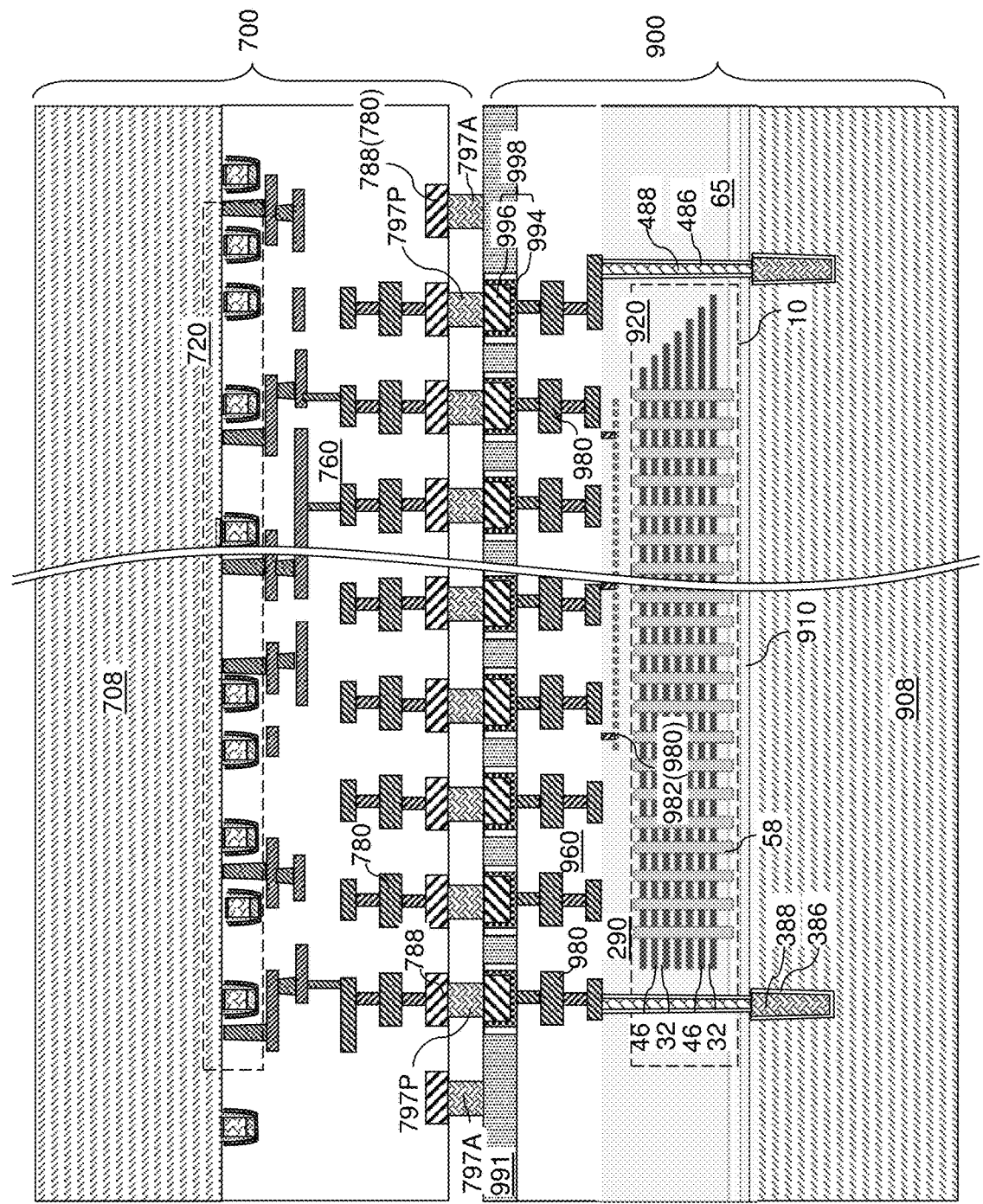
FIG. 7 is a vertical cross-sectional view of a first exemplary structure after the logic die is disposed on the memory die according to an embodiment of the present disclosure.

Referring to FIG. 7, the memory die 900 and the logic die 700 are oriented such that the first metal bonding pads 998 face the second metal bonding pads (797P, 797A). The memory die 900 and the logic die 700 are brought into contact with each other such that the primary metal bonding pads 797P contact the first metal bonding pads 998, and the auxiliary metal bonding pads 797A contact the semiconductor material layer 991.

Generally, a first semiconductor die including first metal bonding pads 998 laterally surrounded by a semiconductor material layer 991 and a second semiconductor die including primary metal bonding pads 797P and auxiliary metal bonding pads 797A are brought into contact with each other so that the primary metal bonding pads 797P contact the first metal bonding pads 998, and the auxiliary metal bonding pads 797A contact the semiconductor material layer 991. In one embodiment, one of the first semiconductor die and the second semiconductor die comprises a memory die 900 including a three-dimensional memory device, and another of the first semiconductor die and the second semiconductor die comprises a logic die 700 configured to control operation of the three-dimensional memory device. The first metal bonding pads 998 and the primary metal bonding pads 797P are configured to provide electrically conductive path for control signals between the memory die 900 and the logic die 700. The second semiconductor die can be disposed on the first semiconductor die such that the primary metal bonding pads 797P are disposed on a respective one of the first metal bonding pads 998 and the auxiliary metal bonding pads contact the semiconductor material layer 991. The auxiliary metal bonding pads 797A are not electrically connected to the memory devices 920 due to the presence of the dielectric spacers which electrically isolate the semiconductor material layer 991 from the first metal bonding pads 998 and the memory devices 920.

Figure 8:
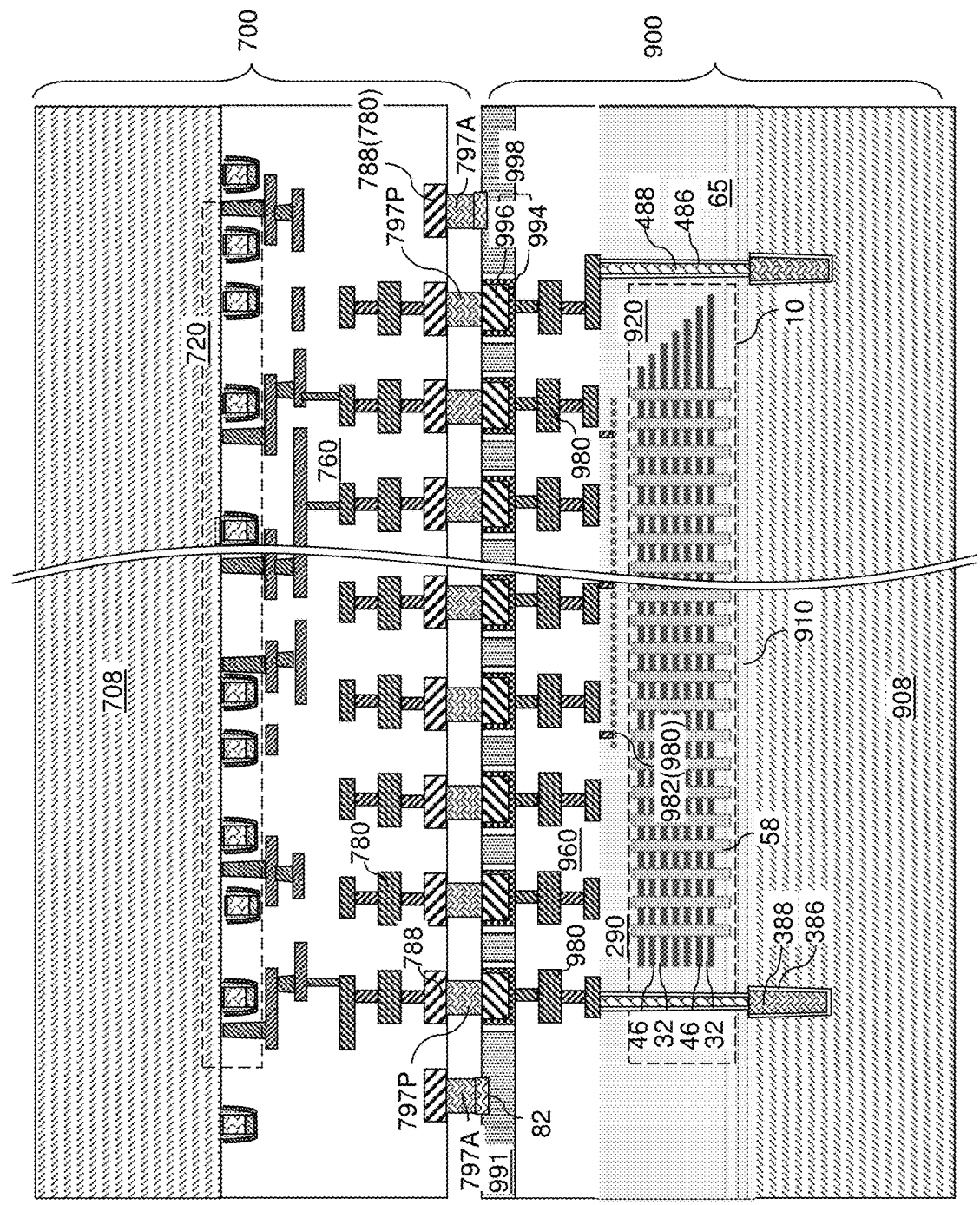
FIG. 8 is a vertical cross-sectional view of a first exemplary bonded assembly after a first anneal process according to an embodiment of the present disclosure.

Referring to FIG. 8, a first anneal process can be performed to form metal-semiconductor compound portions 82. Specifically, the metal-semiconductor compound portions 82 can be formed by reacting surface regions of the auxiliary metal bonding pads 797A with surface portions of the semiconductor material layer 991 in a first thermal anneal process performed at a first elevated temperature. The auxiliary metal bonding pads 797A comprise at least one transition metal element that forms that forms a metal-semiconductor alloy upon reaction with a semiconductor material. For example, the auxiliary metal bonding pads 797A may comprise at least one transition metal element selected from Ni, Co, Pt or Mo that forms a metal silicide material (e.g. portions 82) upon reaction with silicon. The metal silicide may comprise nickel silicide, cobalt silicide, platinum silicide or molybdenum silicide.

Generally, the metal-semiconductor compound portions 82 can be formed by performing the first anneal process at the first elevated temperature while the auxiliary metal bonding pads 797A contact the semiconductor material layer 991. The metallic element(s) of the auxiliary metal bonding pads 797A and the semiconductor material of the semiconductor material layer 991 interdiffuse and react to form the metal-semiconductor compound portions 82. The first elevated temperature and the duration of the first anneal process can be selected such that a metal-semiconductor compound formation reaction processed at the first elevated temperature and forms the metal-semiconductor compound portions 82 at a sufficient thickness so that the metal-semiconductor compound portions 82 provide sufficient bonding strength between the first semiconductor die 900 and the second semiconductor die 700. Preferably, the duration of the first anneal process is relatively short to quickly form a mechanical metal silicide bond between the first and the second semiconductor dies. The first elevated temperature may be a relatively low silicide forming temperature in a range from 300 degrees Celsius to 500 degrees Celsius, although lower and higher temperatures may also be employed. For example, $Ni_2Si$ phase of nickel silicide may be formed at a temperature in a range from about 325 to about 425 degrees Celsius in about 1 to 30 minutes, such as at about 425 degrees Celsius in about 1 minute using rapid thermal annealing (RTA). Thus, the first anneal process may have a relatively quick duration of 30 minutes or less, such as 30 seconds to 10 minutes, for example 45 seconds to 5 minutes, and may be carried out by RTA.

Figure 9:
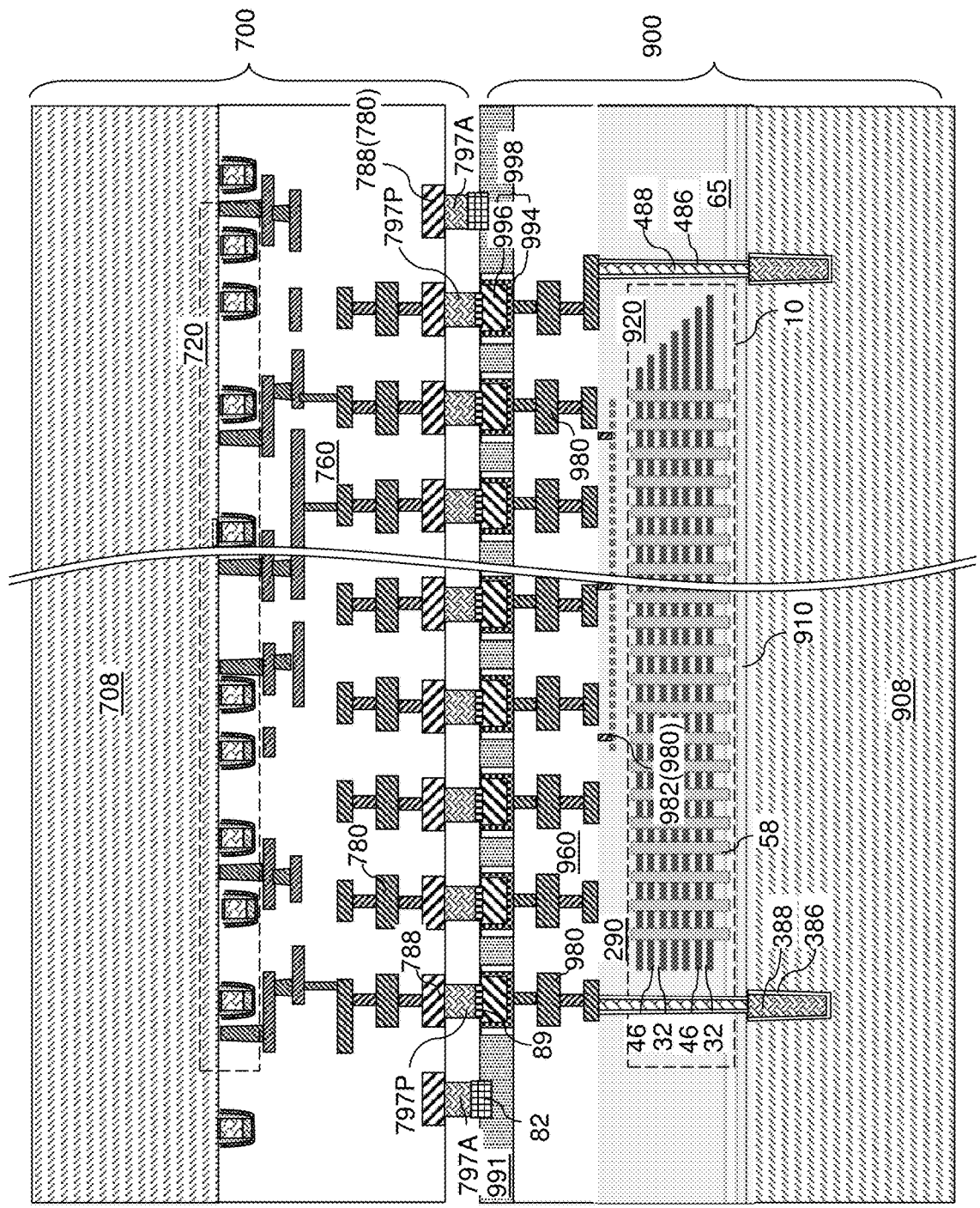
FIG. 9 is a vertical cross-sectional view of the first exemplary bonded assembly after a second anneal process according to an embodiment of the present disclosure.

Referring to FIG. 9, a second anneal process can be performed while the first semiconductor die and the second semiconductor die bonded to each other by the metal-semiconductor compound portions 82 located between the semiconductor material layer 991 and the auxiliary metal bonding pads 797A. During the second anneal process the primary metal bonding pads 797P can be bonded to the first metal bonding pads 998 by metal-to-metal bonding. The duration of the second anneal process may be longer than the duration of the first anneal process. For example, the duration of the second anneal process may be greater than 30 minutes, such as 1 to 3 hours. The second anneal process may be carried out in a furnace rather than by using RTA. Generally, the second elevated temperature may be higher than, the same as, or lower than, the first elevated temperature. In one embodiment, the second elevated temperature is higher than the first elevated temperature. For example, the second elevated temperature may be in a range from 400 degrees Celsius to 800 degrees Celsius, although lower and higher temperatures may also be employed.

In one embodiment, the metal-semiconductor compound portions 82 may expand in volume, and a metal-to-semiconductor ratio within the metal-semiconductor compound portions 82 may decrease during the second anneal process. In one embodiment, the semiconductor material layer 991 comprises, and/or consists essentially of, silicon, and the metal-semiconductor compound portions 82 comprise a metal silicide material of at least one metal, such as at least one transition metal. The primary metal bonding pads 797P are bonded to the first metal bonding pads 998 by metal-to-metal bonding (such as nickel to nickel bonding), and the auxiliary metal bonding pads 797A are bonded to the semiconductor material layer 991 through metal-semiconductor compound portions 82 contacting the semiconductor material layer and a respective one of the auxiliary metal bonding pads.

In the above embodiments, the primary metal bonding pads 797P comprise the same metal as the auxiliary metal bonding pads 797P for ease of fabrication (e.g., such that they can be formed during the same deposition step). In an alternative embodiment, the primary metal bonding pads 797P comprise copper and the auxiliary metal bonding pads 797P comprise a silicide forming metal, such as Ni, Co, Pt or Mo. In this alternative embodiment, the first metal bonding pads 998 may also comprise copper, and the primary metal bonding pads 797P are bonded to the first metal bonding pads 998 by lower temperature copper to copper bonding which may be conducted at a temperature range from 300 degrees Celsius to 400 degrees Celsius.

Figure 10:
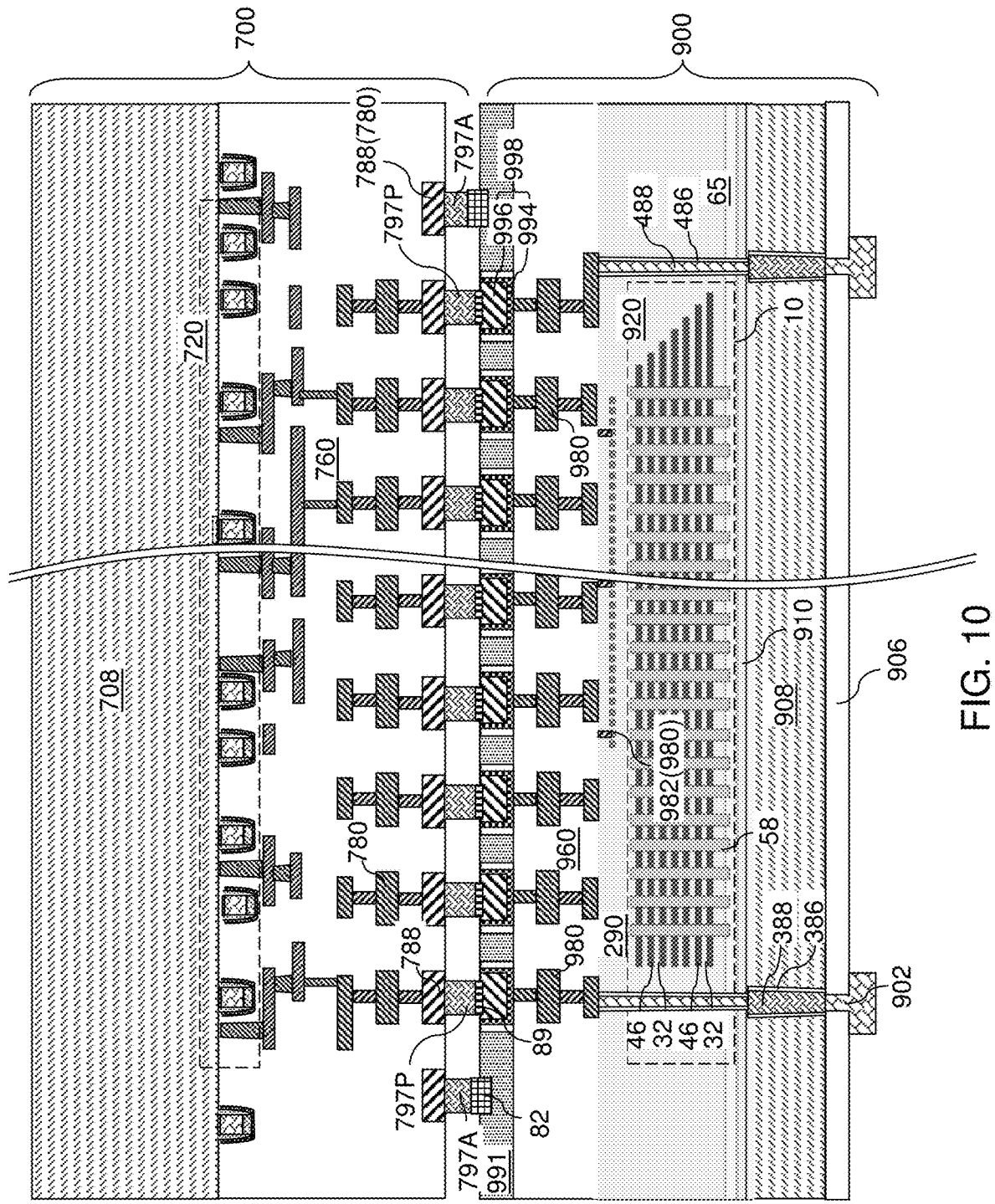
FIG. 10 is a vertical cross-sectional view of the first exemplary bonded assembly after thinning the backside of the memory die and formation of backside bonding pads according to an embodiment of the present disclosure.

Referring to FIG. 10, optional additional processing steps may be optionally performed. For example, one of the first semiconductor die and the second semiconductor die may be thinned, and backside bonding pads may be formed on the backside surfaces of a thinned substrate. In an illustrative example, the memory-side substrate 908 can be thinned from the backside by grinding, polishing, an isotropic etch process, or an anisotropic etch process. The memory-side substrate 908 can be thinned until backside surfaces of the through-substrate via structures 388 are physically exposed. A backside insulating layer 906 can be formed on the backside surface of the memory-side substrate 908, and backside bonding pads 902 can be formed through the backside insulating layer 906 on a respective one of the through-substrate via structures 388.

In another embodiment, the first metal bonding pads and the semiconductor material layer are formed on the logic die, while the primary metal bonding pads and the auxiliary metal bonding pads are formed on the memory die.

Figure 11:
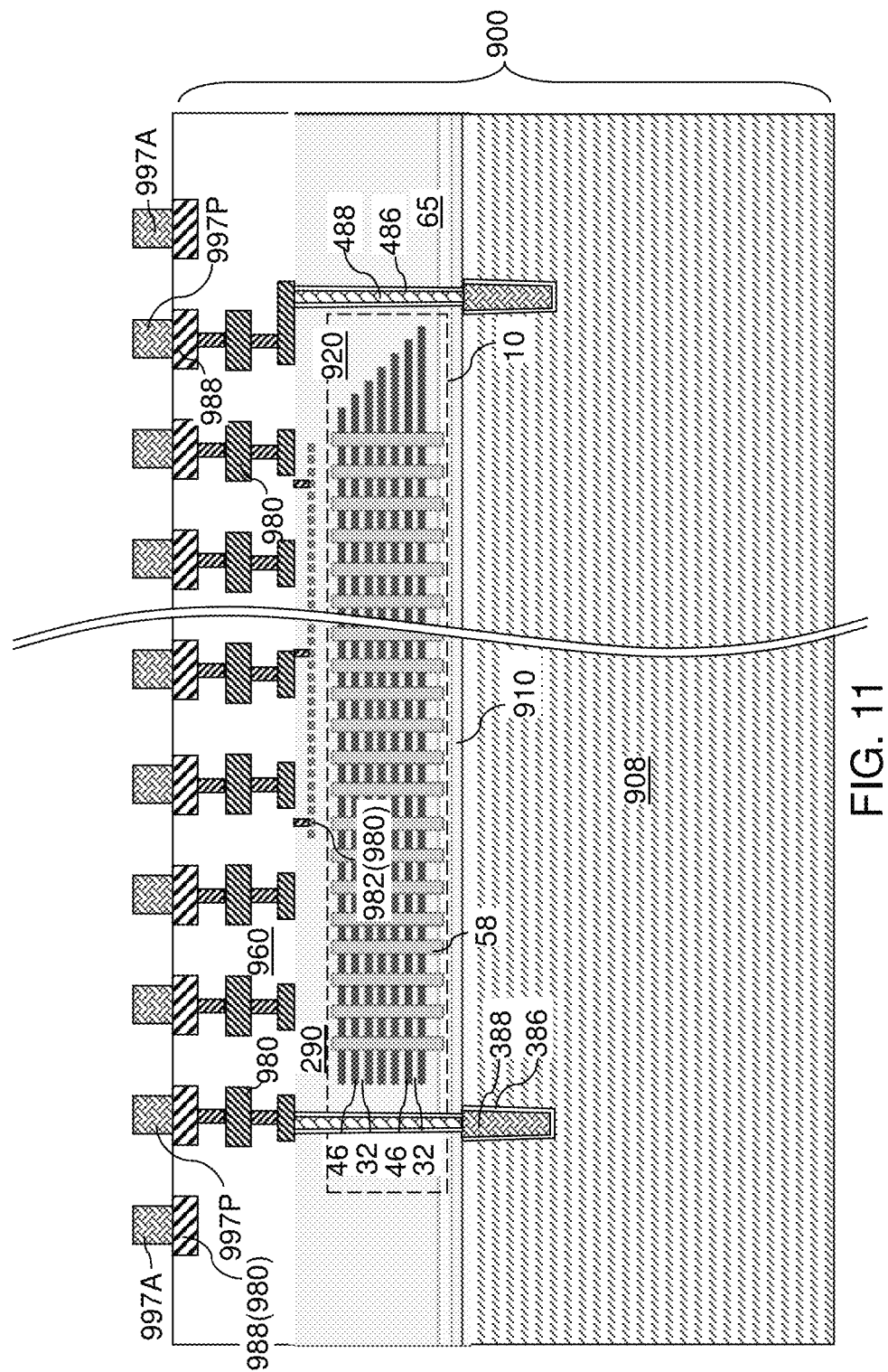
FIG. 11 is a vertical cross-sectional view of an alternative configuration of a memory die according to an embodiment of the present disclosure.

Referring to FIG. 11, an alternative configuration of a memory die 900 is illustrated. In this embodiment, the memory die 900 is employed as a second semiconductor die on which second metal bonding pads (997P, 997A) are formed. The second metal bonding pads (997P, 997A) can have the same material composition as, and may be formed employing the same set of processing steps as the set of processing steps employed to form, the second metal bonding pads (797P, 797A) described above. The second metal bonding pads (997P, 997A) can include primary metal bonding pads 997P that are electrically connected to a respective node of the memory-side semiconductor devices 920 and auxiliary metal bonding pads 997A that are interlaced with, or are located at peripheral regions of, the primary metal bonding pads 997P.

Figure 12:
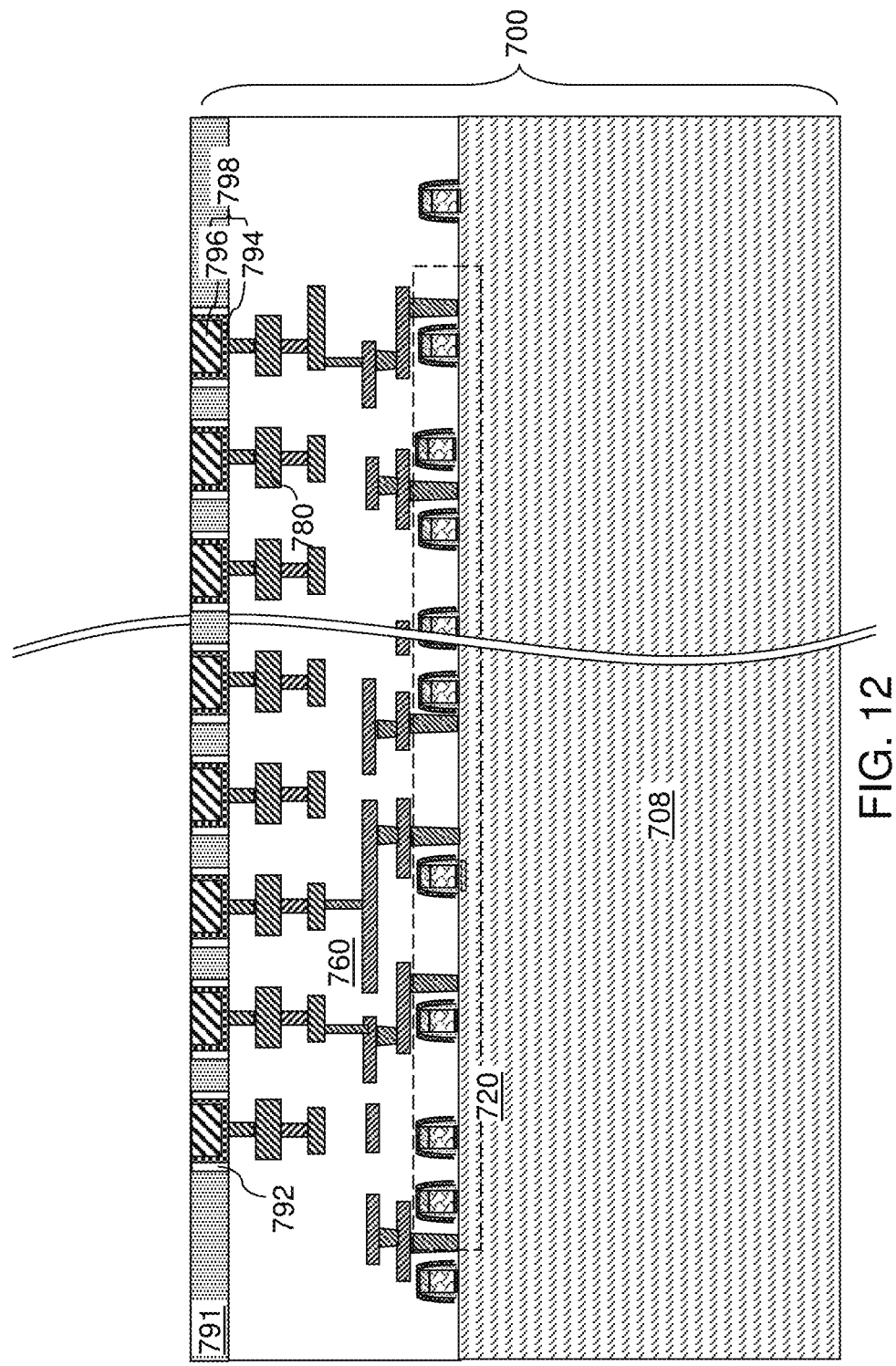
FIG. 12 is a vertical cross-sectional view of an alternative configuration of a logic die according to an embodiment of the present disclosure.

Referring to FIG. 12, an alternative configuration of a logic die 700 is illustrated. In this embodiment, the logic die 700 is employed as a first semiconductor die on which first metal bonding pads 798 and a semiconductor material layer 791 are formed. The semiconductor material layer 791 can have the same material composition as, and may be formed employing the same set of processing steps as the set of processing steps employed to form, the semiconductor material layer 991 described above. Dielectric spacers 792 can be formed on sidewalls of each opening through the semiconductor material layer 791 by performing the same set of processing steps as the set of processing steps employed to form the set of processing steps employed to form the dielectric spacers 992 described above. The first metal bonding pads 798 can have the same material composition as, and may be formed employing the same set of processing steps as the set of processing steps employed to form, the first metal bonding pads 998 described above. Each second metal bonding pad 798 can include a respective metallic barrier liner 794 and a respective a metallic bonding material portion 796.

Figure 13:
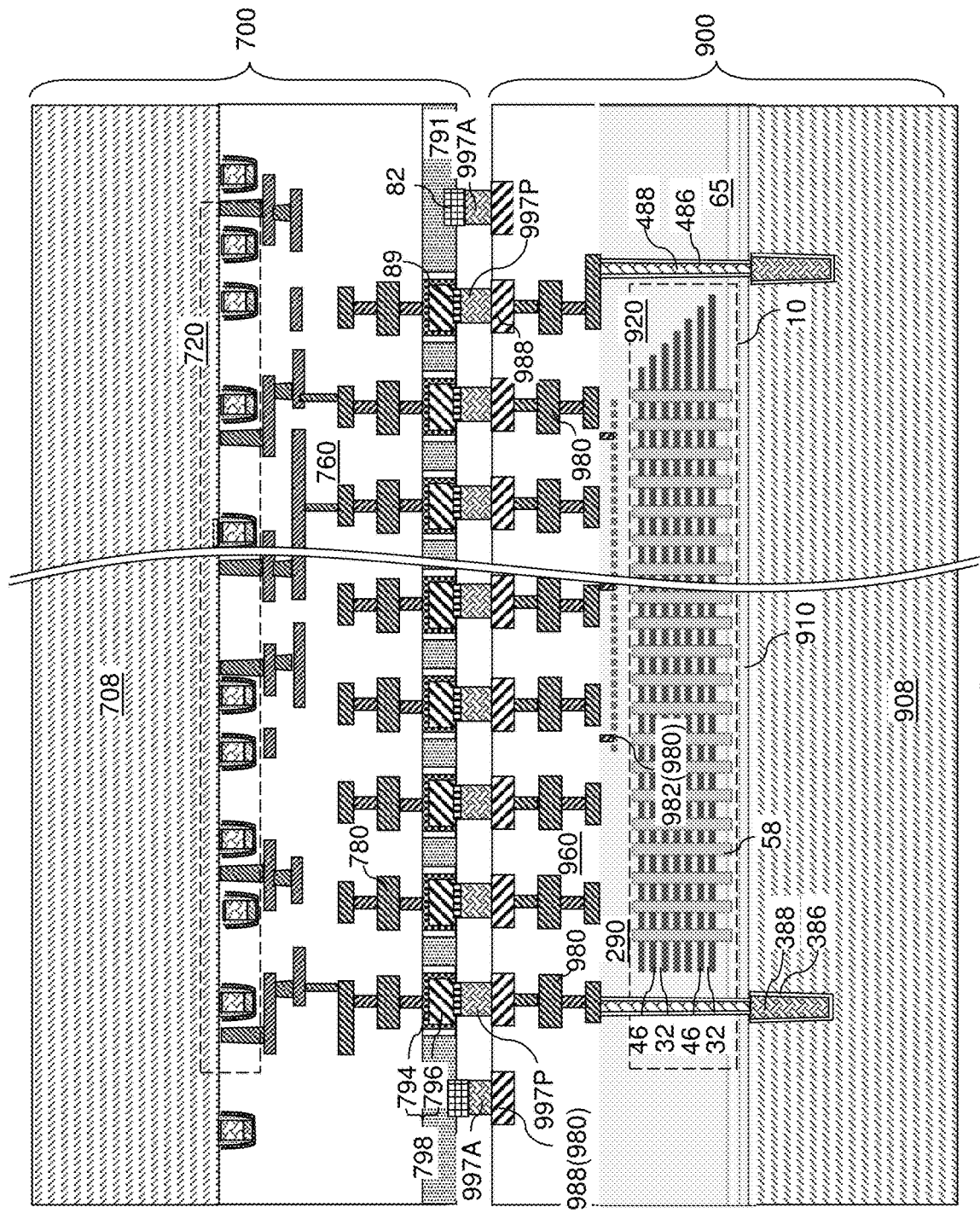
FIG. 13 is a vertical cross-sectional view of a second exemplary bonded assembly after a second anneal process according to an embodiment of the present disclosure.

Referring to FIG. 13, the set of processing steps described with reference to FIGS. 7-9 can be performed with any needed changes to form a bonded assembly of a first semiconductor die (comprising the logic die 700) and a second semiconductor die (comprising the memory die 900). Specifically, the primary metal bonding pads 997P can be aligned to, and can be brought into contact with, the first metal bonding pads 798. The auxiliary metal bonding pads 997A can be brought into contact with the semiconductor material layer 791. A short duration first anneal process can be performed to form metal-semiconductor compound portions 82. Generally, the metal-semiconductor compound portions 82 can be formed by performing the first anneal process at the first elevated temperature while the auxiliary metal bonding pads 997A contact the semiconductor material layer 791. The metallic element(s) of the auxiliary metal bonding pads 997A and the semiconductor material of the semiconductor material layer 791 interdiffuse and react to form the metal-semiconductor compound portions 82. The first elevated temperature and the duration of the first anneal process can be selected such that a metal-semiconductor compound formation reaction processed at the first elevated temperature and forms the metal-semiconductor compound portions 82 at a sufficient thickness so that the metal-semiconductor compound portions 82 provide sufficient mechanical bonding strength between the first semiconductor die and the second semiconductor die as described above.

A second anneal process can be subsequently performed while the first semiconductor die and the second semiconductor die are mechanically bonded to each other. The primary metal bonding pads 997P can be bonded to the first metal bonding pads 798 by metal-to-metal bonding. In one embodiment, the second anneal process duration may be longer than the first anneal process duration. Generally, second elevated temperature may be higher than, the same as, or lower than, the first elevated temperature. In one embodiment, the second elevated temperature is higher than the first elevated temperature, as described above.

In one embodiment, the metal-semiconductor compound portions 82 may expand in volume, and a metal-to-semiconductor ratio within the metal-semiconductor compound portions 82 may decrease during the second anneal process. In one embodiment, the semiconductor material layer 791 comprises, and/or consists essentially of, silicon, and the metal-semiconductor compound portions 82 comprise a metal silicide material of at least one metal, such as at least one transition metal. The primary metal bonding pads 997P are bonded to the first metal bonding pads 798 by metal-to-metal bonding, and the auxiliary metal bonding pads are bonded to the semiconductor material layer through metal-semiconductor compound (e.g., silicide) portions contacting the semiconductor material layer and a respective one of the auxiliary metal bonding pads.

Figure 14:
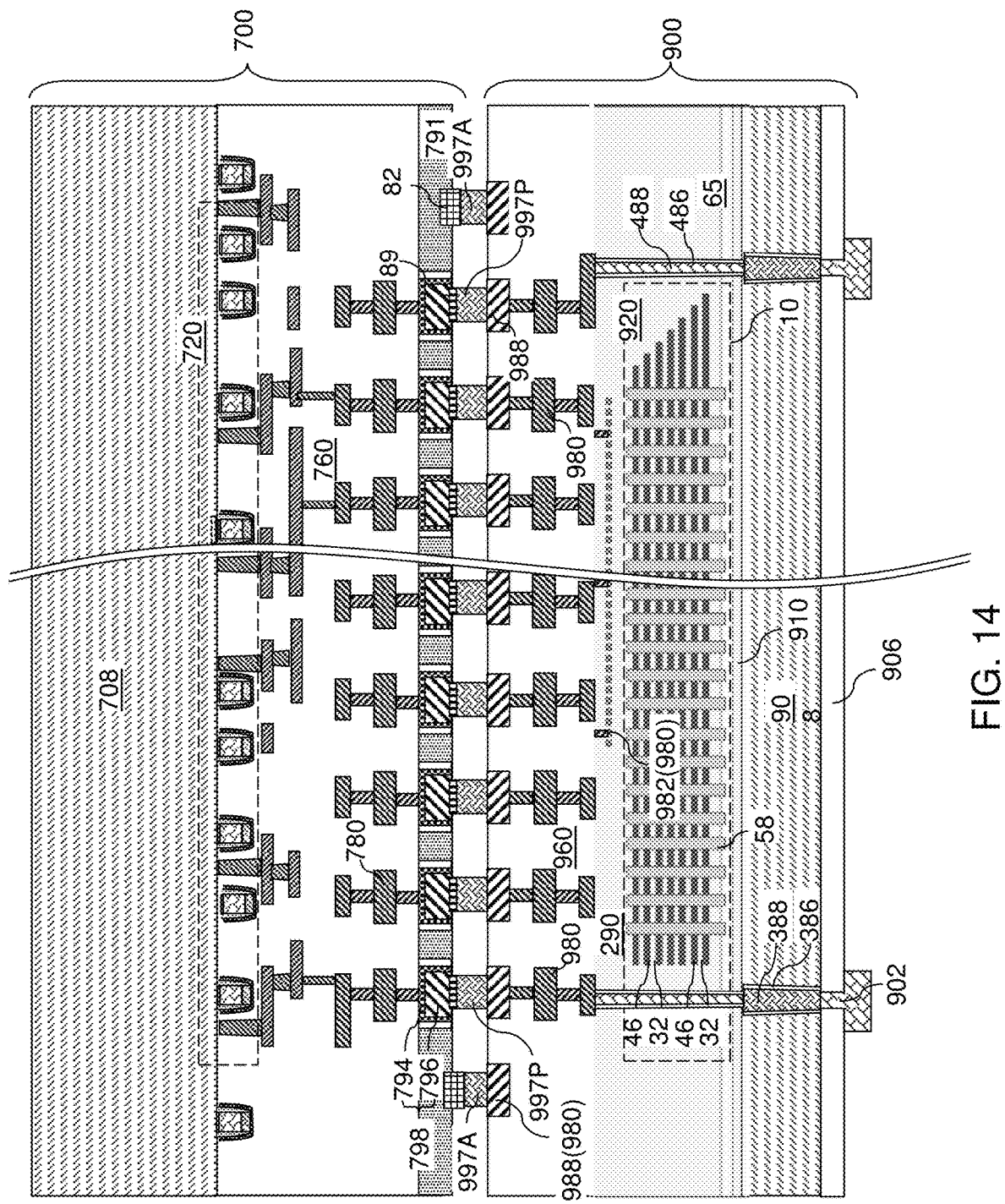
FIG. 14 is a vertical cross-sectional view of the second exemplary bonded assembly after thinning the backside of the memory die and formation of backside bonding pads according to an embodiment of the present disclosure.

Referring to FIG. 14, additional processing steps may be optionally performed. For example, one of the first semiconductor die and the second semiconductor die may be thinned, and backside bonding pads may be formed on the backside surfaces of a thinned substrate. In an illustrative example, the memory-side substrate 908 can be thinned from the backside by grinding, polishing, an isotropic etch process, or an anisotropic etch process. The memory-side substrate 908 can be thinned until backside surfaces of the through-substrate via structures 388 are physically exposed. A backside insulating layer 906 can be formed on the backside surface of the memory-side substrate 908, and backside bonding pads 902 can be formed through the backside insulating layer 906 on a respective one of the through-substrate via structures 388.

During formation of the bonded assemblies of the embodiments of the present disclosure, the first semiconductor die may be provided as a semiconductor die within a first wafer including a respective plurality of semiconductor dies, or may be provided as a singulated (i.e., diced) semiconductor die. Likewise, the second semiconductor die may be provided as a semiconductor die within a second wafer including a respective plurality of semiconductor dies, or may be provided as a singulated semiconductor die.

Referring to FIG. 15A, a die-to-wafer bonding scheme is illustrated, in which singulated logic dies 700 are bonded to a respective memory die 900 on a memory wafer 9000 including a plurality of memory dies 900. In one embodiment, the memory dies 900 may be configured as first semiconductor dies including first metal bonding pads 998 embedded in a semiconductor material layer 991, and the logic dies 700 may be configured as second semiconductor dies including second metal bonding pads (797P, 797A). Alternatively, the logic dies 700 may be configured as first semiconductor dies including first metal bonding pads 798 embedded in a semiconductor material layer 791, and the memory dies 900 may be configured as second semiconductor dies including second metal bonding pads (997P, 997A).

Referring to FIG. 15B, another die-to-wafer bonding scheme is illustrated, in which singulated memory dies 900 are bonded to a respective logic die 700 on a logic wafer 7000 including a plurality of logic dies 700. In one embodiment, the memory dies 900 may be configured as first semiconductor dies including first metal bonding pads 998 embedded in a semiconductor material layer 991, and the logic dies 700 may be configured as second semiconductor dies including second metal bonding pads (797P, 797A). Alternatively, the logic dies 700 may be configured as first semiconductor dies including first metal bonding pads 798 embedded in a semiconductor material layer 791, and the memory dies 900 may be configured as second semiconductor dies including second metal bonding pads (997P, 997A).

Figure 16:
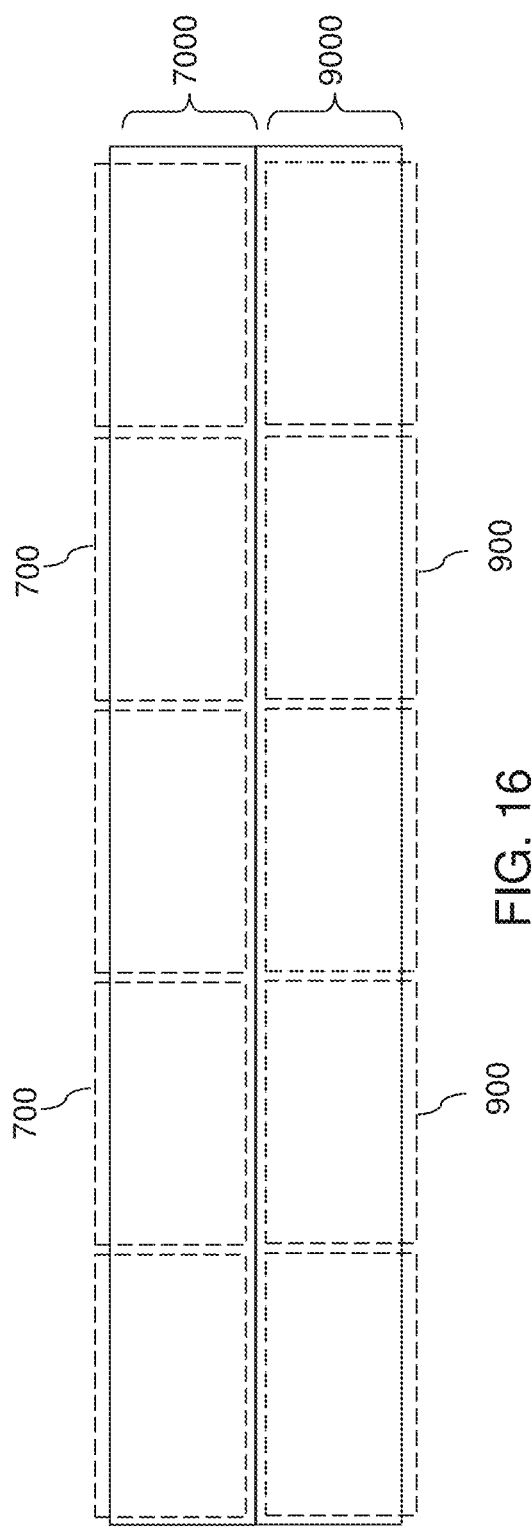
FIG. 16 illustrates a wafer-to-wafer bonding scheme that may be employed to form bonded assemblies of the present disclosure.

Referring to FIG. 16, a wafer-to-wafer bonding scheme is illustrated, in which each memory dies 900 on a memory wafer 9000 including a plurality of memory dies 900 is bonded to a respective logic die 700 on a logic wafer 7000 including a plurality of logic dies 700. In one embodiment, the memory dies 900 may be configured as first semiconductor dies including first metal bonding pads 998 embedded in a semiconductor material layer 991, and the logic dies 700 may be configured as second semiconductor dies including second metal bonding pads (797P, 797A). Alternatively, the logic dies 700 may be configured as first semiconductor dies including first metal bonding pads 798 embedded in a semiconductor material layer 791, and the memory dies 900 may be configured as second semiconductor dies including second metal bonding pads (997P, 997A).

Figure 17:
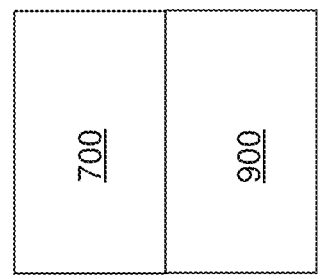
FIG. 17 illustrates a die-to-die bonding scheme that may be employed to form bonded assemblies of the present disclosure.

Referring to FIG. 17, a die-to-die bonding scheme is illustrated, in which a singulated memory die 900 is bonded to a singulated logic die 700. In one embodiment, the memory die 900 may be configured as a first semiconductor die including first metal bonding pads 998 embedded in a semiconductor material layer 991, and the logic die 700 may be configured as a second semiconductor die including second metal bonding pads (797P, 797A). Alternatively, the logic die 700 may be configured as a first semiconductor die including first metal bonding pads 798 embedded in a semiconductor material layer 791, and the memory die 900 may be configured as a second semiconductor die including second metal bonding pads (997P, 997A).

Referring to all drawings and according to various embodiments of the present disclosure, a bonded assembly of a first semiconductor die and a second semiconductor die is provided. The first semiconductor die comprises first semiconductor devices (920 or 720), first metal interconnect structures (980 or 780) embedded in first dielectric material layers (960 or 760), and first metal bonding pads (998 or 798) laterally surrounded by a semiconductor material layer (991 or 791). The second semiconductor die comprises second semiconductor devices (720 or 920), second metal interconnect structures (780 or 980) embedded in second dielectric material layers (760 or 960), and second metal bonding pads {(797P, 797A) or (997P, 997A)} that comprise primary metal bonding pads (797P or 997P) and auxiliary metal bonding pads (797A or 997A). The primary metal bonding pads (797P or 997P) are bonded to the first metal bonding pads (998 or 798) by metal-to-metal bonding. The auxiliary metal bonding pads (797A or 997A) are bonded to the semiconductor material layer (991 or 791) through metal-semiconductor compound portions 82 contacting the semiconductor material layer (991 or 791) and a respective one of the auxiliary metal bonding pads (797A or 997A).

In one embodiment, the semiconductor material layer (991 or 791) comprises silicon; and the metal-semiconductor compound portions 82 comprise a metal silicide material. In one embodiment, the auxiliary metal bonding pads (797A or 997A) comprise a transition metal element that forms that forms the metal silicide material upon reaction with silicon; and the metal silicide material comprises a silicide of the transition metal element.

In one embodiment, the primary metal bonding pads (797P or 997P) and auxiliary metal bonding pads (797A or 997A) have a same metallic composition. In one embodiment, the primary metal bonding pads (797P or 997P) and auxiliary metal bonding pads (797A or 997A) comprise nickel, cobalt, platinum or molybdenum at an atomic percentage greater than 90%, and the metal silicide material comprises nickel silicide, cobalt silicide, platinum silicide or molybdenum silicide.

In one embodiment, the primary metal bonding pads (797P or 997P) are electrically connected to nodes of the second semiconductor devices (720 or 920); and the auxiliary metal bonding pads (797A or 997A) are electrically isolated from the second semiconductor devices (720 or 920) and from the first semiconductor devices (920 or 720). In one embodiment, each of the first metal bonding pads (998, 798) is electrically isolated from the semiconductor material layer (991 or 791) by and is laterally surrounded by a respective dielectric spacer (992 or 792).

In one embodiment, each of the first metal bonding pads (998 or 798) comprises a nickel-containing portion that contains nickel at an atomic percentage greater than 90%; and each of the second metal bonding pads {(797P, 797A) or (997P, 997A)} comprises nickel at an atomic percentage greater than 90%. In one embodiment, each of the first metal bonding pads (998 or 798) comprises a metallic barrier liner (994 or 794) comprising a conductive metallic nitride material or a tungsten-containing material and embedding a respective nickel-containing portion.

In one embodiment, one of the first semiconductor die and the second semiconductor die comprises a memory die 900 including a three-dimensional memory device; and another of the first semiconductor die and the second semiconductor die comprises a logic die 700 configured to control operation of the three-dimensional memory device. The first metal bonding pads (998 or 798) and the primary metal bonding pads (797P or 997P) are configured to provide electrically conductive path for control signals between the memory die 900 and the logic die 700.

The various embodiments of the present disclosure can be employed to provide a two-step bonding process, in which the auxiliary (e.g., dummy) metal bonding pads (797A or 997A) are mechanically bonded to a semiconductor material layer (991 or 791) using shorter duration silicide bonding, and then longer duration metal-to-metal bonding is performed between two semiconductor dies to establish electrical connections between the respective bonding pads of the two semiconductor dies, while the silicide portions provide structural support and prevent lateral movement between the first semiconductor die and the second semiconductor die during the metal-to-metal bonding process.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

The invention claimed is:

1. A bonded assembly of a first semiconductor die and a second semiconductor die, wherein:
   the first semiconductor die comprises first semiconductor devices, first metal interconnect structures embedded in first dielectric material layers, and first metal bonding pads laterally surrounded by a semiconductor material layer;
   the second semiconductor die comprises second semiconductor devices, second metal interconnect structures embedded in second dielectric material layers, and second metal bonding pads that comprise primary metal bonding pads and auxiliary metal bonding pads;
   the primary metal bonding pads are bonded to the first metal bonding pads by metal-to-metal bonding; and
   the auxiliary metal bonding pads are bonded to the semiconductor material layer through metal-semiconductor compound portions contacting the semiconductor material layer and a respective one of the auxiliary metal bonding pads.

2. The bonded assembly of claim 1, wherein:
   the semiconductor material layer comprises silicon; and
   the metal-semiconductor compound portions comprise a metal silicide material.

3. The bonded assembly of claim 2, wherein:
   the auxiliary metal bonding pads comprise a transition metal element that forms that forms the metal silicide material upon reaction with silicon; and
   the metal silicide material comprises a silicide of the transition metal element.

4. The bonded assembly of claim 3, wherein the primary metal bonding pads and auxiliary metal bonding pads have a same metallic composition.

5. The bonded assembly of claim 4, wherein the primary metal bonding pads and auxiliary metal bonding pads comprise nickel, cobalt, platinum or molybdenum at an atomic percentage greater than 90%, and the metal silicide material comprises nickel silicide, cobalt silicide, platinum silicide or molybdenum silicide.

6. The bonded assembly of claim 1, wherein:
   the primary metal bonding pads are electrically connected to nodes of the second semiconductor devices; and the auxiliary metal bonding pads are electrically isolated from the second semiconductor devices and from the first semiconductor devices.

7. The bonded assembly of claim 1, wherein each of the first metal bonding pads is electrically isolated from the semiconductor material layer by and is laterally surrounded by a respective dielectric spacer.

8. The bonded assembly of claim 1, wherein:
each of the first metal bonding pads comprises a nickel-containing portion that contains nickel at an atomic percentage greater than 90%; and
each of the second metal bonding pads comprises at least one nickel at an atomic percentage greater than 90%.

9. The bonded assembly of claim 8, wherein each of the first metal bonding pads comprises a metallic barrier liner comprising a conductive metallic nitride material or a tungsten-containing material and embedding a respective nickel-containing portion.

10. The bonded assembly of claim 1, wherein:
one of the first semiconductor die and the second semiconductor die comprises a memory die including a three-dimensional memory device; and
another of the first semiconductor die and the second semiconductor die comprises a logic die configured to control operation of the three-dimensional memory device.

11. The bonded assembly of claim 10, wherein the first metal bonding pads and the primary metal bonding pads are configured to provide electrically conductive path for control signals between the memory die and the logic die.

12. A method of forming a bonded assembly, the method comprising:
providing a first semiconductor die comprising first semiconductor devices, first metal interconnect structures embedded in first dielectric material layers, and first metal bonding pads laterally surrounded by a semiconductor material layer;
providing a second semiconductor die comprising second semiconductor devices, second metal interconnect structures embedded in second dielectric material layers, and second metal bonding pads that comprise primary metal bonding pads and auxiliary metal bonding pads;
disposing the second semiconductor die on the first semiconductor die such that the primary metal bonding pads are disposed on a respective one of the first metal bonding pads and the auxiliary metal bonding pads contact the semiconductor material layer;
forming metal-semiconductor compound portions by reacting surface regions of the auxiliary metal bonding pads with surface portions of the semiconductor material layer during a first anneal process; and
bonding the primary metal bonding pads to the first metal bonding pads by metal-to-metal bonding during a second anneal process after the first anneal process.

13. The method of claim 12, wherein:
the first anneal process is performed at a first elevated temperature for a first duration while the auxiliary metal bonding pads contact the semiconductor material layer; and
the second anneal process is performed at a second elevated temperature for a second duration which is longer than the first duration after the first anneal process while the second semiconductor die and the first semiconductor die are bonded to each other by metal-semiconductor compound portions.

14. The method of claim 13, wherein:
the second elevated temperature is higher than the first elevated temperature; and
the metal-semiconductor compound portions expand in volume and a metal-to-semiconductor ratio within the metal-semiconductor compound portions decreases during the second anneal process.

15. The method of claim 12, wherein:
the semiconductor material layer comprises silicon; and
the metal-semiconductor compound portions comprise a metal silicide material.

16. The method of claim 15, wherein the primary metal bonding pads and auxiliary metal bonding pads comprise nickel, cobalt, platinum or molybdenum at atomic percentage greater than 90%, and the metal silicide material comprises nickel silicide, cobalt silicide, platinum silicide or molybdenum silicide.

17. The method of claim 12, further comprising:
forming pad cavities through the semiconductor material layer;
forming dielectric spacers on sidewalls of the semiconductor material layer in the pad cavities; and
forming the first metal bonding pads in the pad cavities such that each of the first metal bonding pads is electrically isolated from the semiconductor material layer by the dielectric spacers.

18. The method of claim 12, wherein:
the primary metal bonding pads are electrically connected to nodes of the second semiconductor devices; and
the auxiliary metal bonding pads are electrically isolated from the second semiconductor devices and from the first semiconductor devices.

19. The method of claim 12, wherein:
the first semiconductor die is provided as a semiconductor die on a first wafer including a respective plurality of semiconductor dies, or is provided as a singulated semiconductor die; and
the second semiconductor die is provided as a semiconductor die on a second wafer including a respective plurality of semiconductor dies, or is provided as a singulated semiconductor die.

20. The method of claim 12, wherein:
one of the first semiconductor die and the second semiconductor die comprises a memory die including a three-dimensional memory device; and
another of the first semiconductor die and the second semiconductor die comprises a logic die configured to control operation of the three-dimensional memory device.

* * * * *